United States Patent [19]

Neuder et al.

[11] Patent Number: 4,641,348

[45] Date of Patent: Feb. 3, 1987

[54] TIMING OR LOGIC STATE ANALYZER WITH AUTOMATIC QUALIFIED INFERENTIAL MARKING AND POST PROCESSING OF CAPTURED TRACE DATA

[75] Inventors: David L. Neuder; Joel A. Zellmer, both of Colorado Springs, Colo.

[73] Assignee: Hewlett-Packard Company, Palo Alto, Calif.

[21] Appl. No.: 550,322

[22] Filed: Nov. 9, 1983

[51] Int. Cl.$^4$ .................. G01R 13/32; G06K 9/00
[52] U.S. Cl. .................. 382/1; 324/73 AT; 324/77 R; 364/487; 364/580
[58] Field of Search ........... 324/73 AT, 77 R, 77 A; 364/487, 580, 579; 382/1, 10, 69

[56] References Cited

U.S. PATENT DOCUMENTS

| | | | |
|---|---|---|---|
| 4,100,532 | 7/1978 | Farnbach | 382/1 |
| 4,376,298 | 3/1983 | Sokol et al. | 364/580 |
| 4,495,642 | 1/1985 | Zellmer | 382/1 |
| 4,507,740 | 3/1985 | Star et al. | 324/77 R |
| 4,510,572 | 4/1985 | Reece et al. | 324/73 AT |
| 4,554,636 | 11/1985 | Maggi et al. | 324/73 AT |

*Primary Examiner*—Leo H. Boudreau
*Attorney, Agent, or Firm*—Edward L. Miller

[57] ABSTRACT

A timing or logic state analyzer automatically places marks into a captured trace measurement. The definition of each mark may include an associated collection of logical conditions in the captured data. Once the trace measurement is complete the analyzer searches through the captured data, locates where any defined conditions occur and adds the associated mark into the corresponding location of the reconstructed waveforms or trace list. Certain marks may be placed at each occurrence of a specified event in the trace, while other marks are restricted to placement at the first occurrence. Marks can be defined in terms of prior and subsequent occurrence of other marks, or of other features in the trace such as a user positionable cursor or a stated sample number. The definition of the marks need not be specified prior to the trace measurement, and an existing trace measurement already captured can be examined and re-examined with different marking schemes without repeating the overall trace measurement. Additionally, certain measurements can be made upon the marks. The time interval between a selected pair of marks can be automatically measured, as can the number of other marks between that pair of marks. And finally, repeated trace measurements with marks can be executed automatically with the resulting series of time interval or count measurements automatically characterized with the statistics maximum, minimum, mean and standard deviation.

38 Claims, 11 Drawing Figures

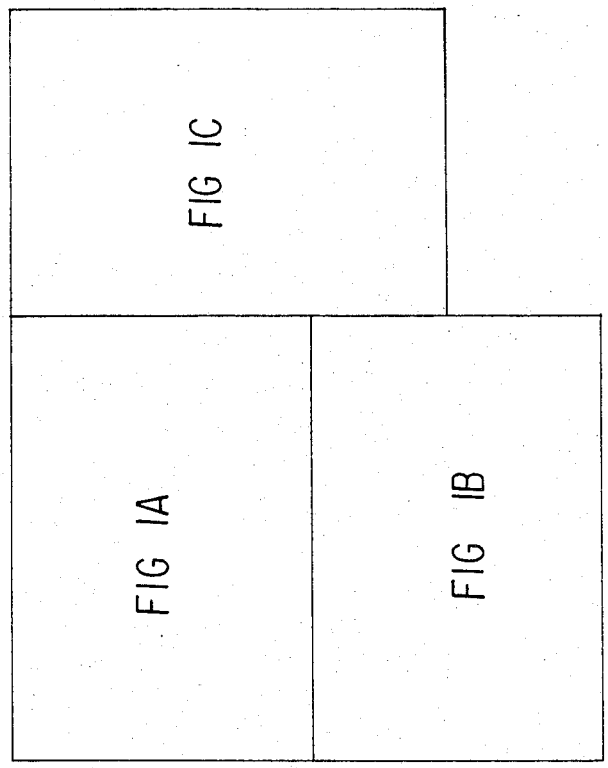

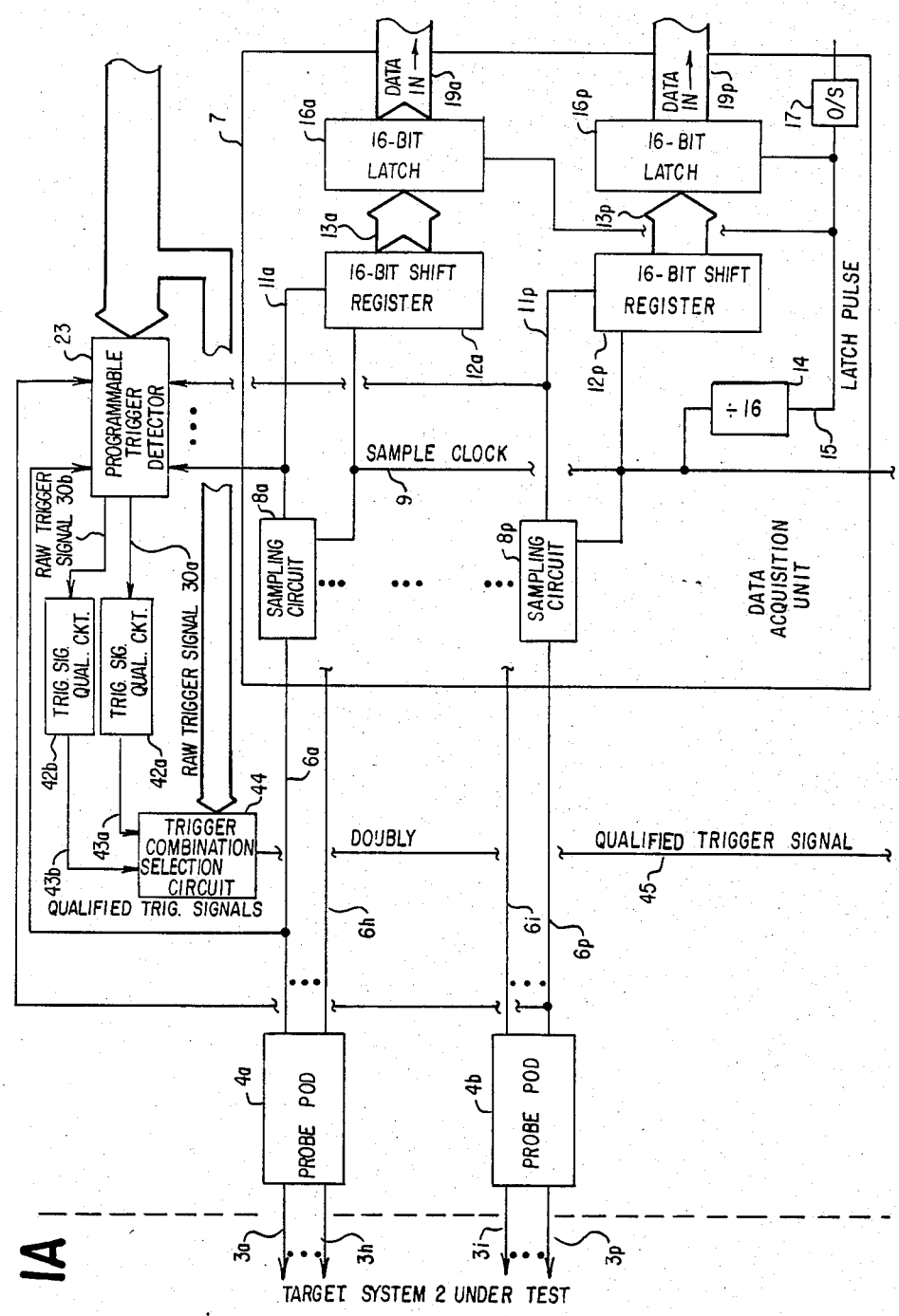
FIG IA

TIMING OR LOGIC STATE ANALYZER WITH AUTOMATIC QUALIFIED INFERENTIAL MARKING AND POST PROCESSING OF CAPTURED TRACE DATA

REFERENCE TO RELATED APPLICATION

The subject matter of this application is related to a U.S. patent application entitled TIMING ANALYZER WITH COMBINATION TRANSITION AND DURATION TRIGGER, Ser. No. 352,672, now U.S. Pat. No. 4,495,642, filed Feb. 26, 1982, by Joel A. Zellmer and assigned to Hewlett-Packard Company. U.S. patent application Ser. No. 352,672 is hereby expressly incorporated herein by reference.

BACKGROUND AND SUMMARY OF THE INVENTION

Conventional timing and logic state analyzers have been equipped with manually positionable marks. These marks are visual indicators that identify locations of interest in the captured trace, and may also serve to delimit the endpoints of an interval whose length of time is then ascertainable without repeating the measurement that produced the captured trace. Such marks in a display may take the form of labeled cursors. The user positions them by first inspecting the displayed trace of a previously performed measurement to visually locate conditions of interest. Once such a location is found the desired mark is positioned thereto through some manual action, such as issuing an appropriate command or manipulation of an associated control. However, such visual inspection to find the various locations in the first place can be a bothersome task requiring the user to scroll through segments of a display including many signals while looking for some particular relationship between those signals, and then repeating the process for each additional mark. Such a marking process may be said to expressly position marks.

It would be desirable if the user could simply specify the location of a mark in terms of the particular relationship that is of interest between the traced signals. The analyzer itself would then search through the sampled measurement data in its acquisition memory to locate the specified relationship of interest, whereupon it would automatically place the mark into the trace at that location. Such a marking process may be said to inferentially position marks. It would be especially beneficial if the rule of inference used to inferentially position a mark could include qualification conditions whose satisfaction depends upon certain events within the traced signals. For example, a certain pattern upon selected signals could be required to occur for either greater than or less than a specified duration. Such extended inferential marking may be referred to as qualified inferential marking. It would also be desirable if the location of subsequent marks could be specified with reference to marks already placed; e.g., specifying that a second mark is to be located after the location in the trace of a first mark.

Once the marks are in place it would be of further advantage if the user could instruct the timing analyzer to make certain measurements pertaining to the marks. For example, it may be desirable to know the length of time between two marks, or the number of marks occurring between two designated marks. The latter measurement allows the user to learn how many times a certain event occurs within a designated region of interest. Still further advantage can be gained by repetitively capturing a series of traces, placing the marks anew in each newly captured trace, measuring the time interval or counting the number of marks as explained above, and keeping certain statistical records pertaining to the measured time interval or count. In particular, it is desirable to determine the maximum and minimum measured values, as well as the mean and stardard deviation. After a designated number of traces have been captured these statistics can be displayed as part of the display for the last captured trace.

Other useful features would include the ability to halt the repetitive execution of the series of trace measurements upon detection of some condition exhibited by the latest captured trace. Such conditions may include whether a time interval between two specified marks is greater than or less than a selected value, whether the number of intervening marks between two specified marks is greater than or less than a selected number, and whether or not a specified sequence of marks occurred in the captured trace. This last condition is particularly interesting since it amounts to a type of extended post facto trigger. That is, it can be used to identify sequential occurrences of interest in the data that cannot be detected in real time at the high speeds at which the data is sampled and stored. But they can be detected by examining the trace after it is stored. A detected sequence causes that trace to be retained. Still another useful feature would be the ability to compress a captured trace to just those samples that are marked.

These and other desirable features relating to use of marks in the trace of a timing analyzer or logic state analyzer are accomplished by equipping the analyzer with mechanisms that respond to appropriate commands by searching through the stored trace data in the acquisition memory. Upon detection of a specified condition the associated mark is added to the trace. Once the marks are in place an additional mechanism searches the marked trace to determine a desired time interval or count and calculates the statistics of interest. Further mechanisms examine the marks in the captured trace to determine if a series of repetitive measurements is to be concluded.

BRIEF DESCRIPTION OF THE DRAWINGS AND OF THE APPENDICES

FIGS. 1; 1A, 1B and 1C are a simplified general block diagram of a timing analyzer to which the invention is applicable.

Figure 2:
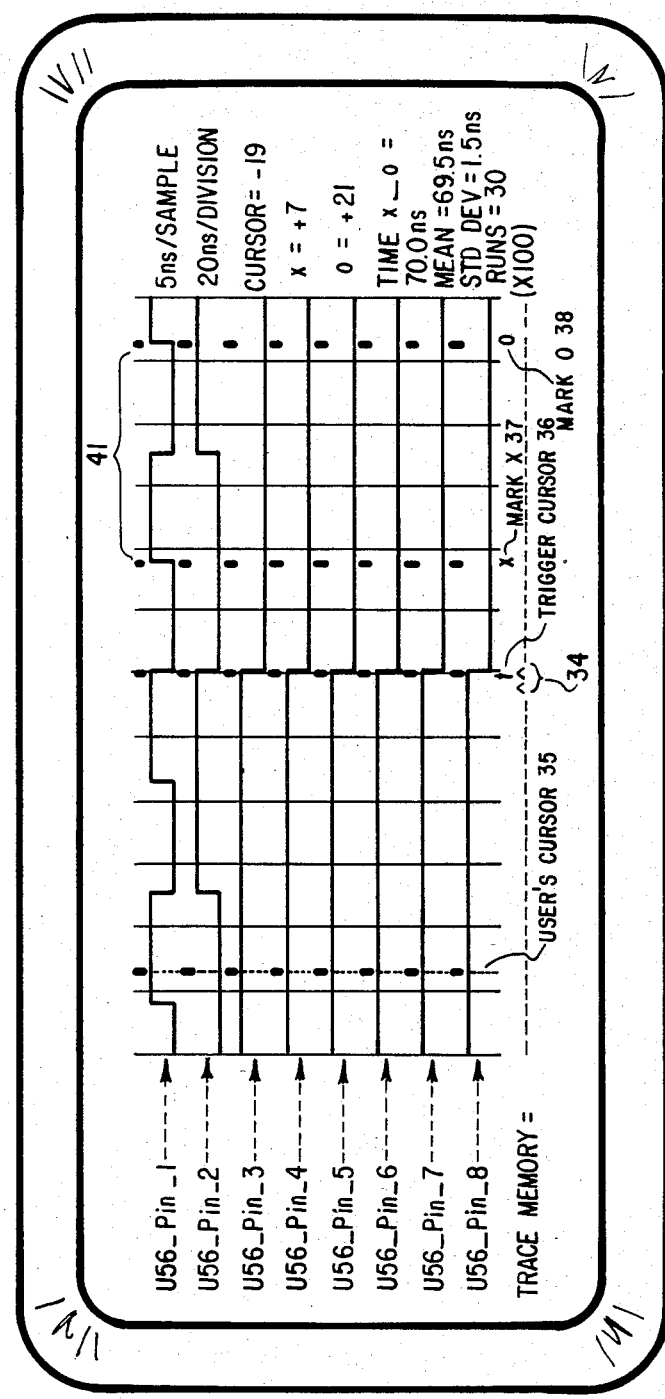
FIG. 2 is an illustration of reconstructed waveform diagrams and some associated statistical measurements in a trace displayed by a timing analyzer that automatically and inferentially positions qualified marks in response to a specification supplied by the user.

Appendix A is a listing of a command file that includes a post processing specification associated with the automatically and inferentially positioned marks of FIG. 2.

Appendix B is a listing of various commands and their syntaxes that may appear in the post processing specification of Appendix A.

Appendices C1–C3 are summaries of respective format, trace and post processing specifications pertaining to FIG. 2.

Figure 3:
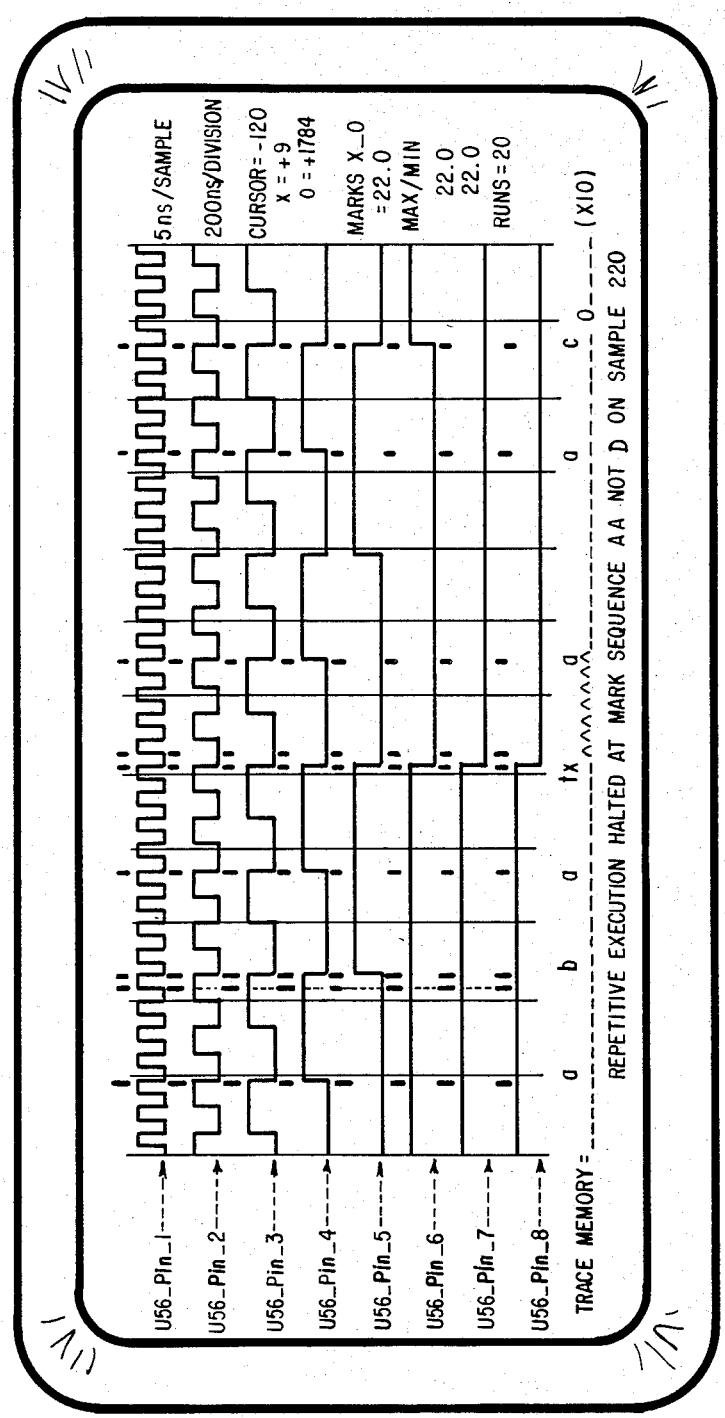
FIG. 3 is another illustration of reconstructed waveform diagrams and some associated statistical measurements in a trace displayed by a timing analyzer that automatically and inferentially positions qualified marks in response to a specification supplied by the user.

Appendices D1–D3 are summaries of respective format, trace and post processing specifications pertaining to FIG. 3.

Appendix E is an abbreviated illustration of a complete tabular trace listing, including automatically and inferentially placed marks, corresponding to FIG. 3.

Appendices F1 and F2 respectively illustrate a post processing specification including a command to condense the listing of Appendix E to just those samples that are marked and the resulting condensed tabular trace listing.

DESCRIPTION OF THE PREFERRED EMBODIMENT

Figure 1B:
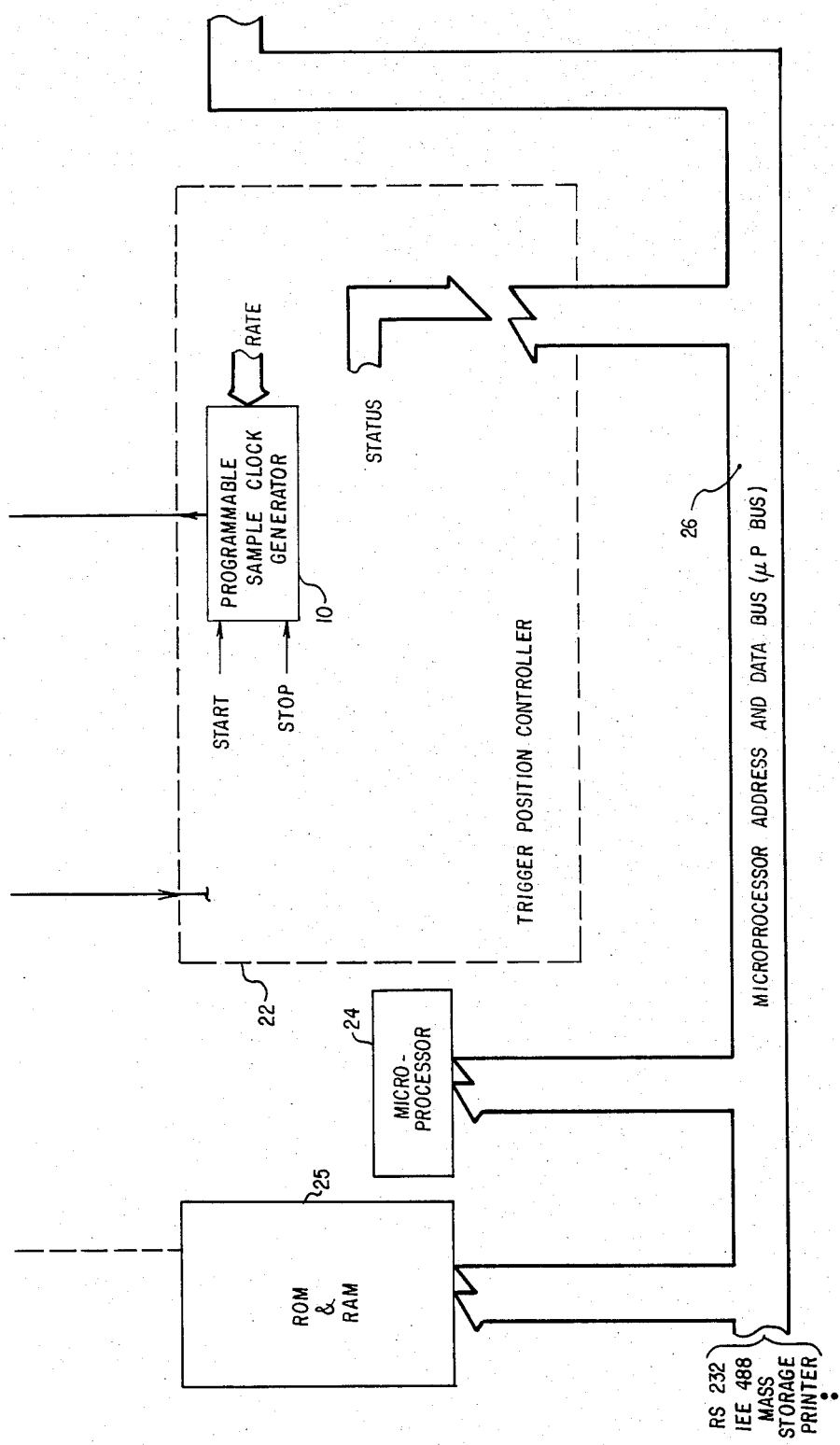
Figure 1C:
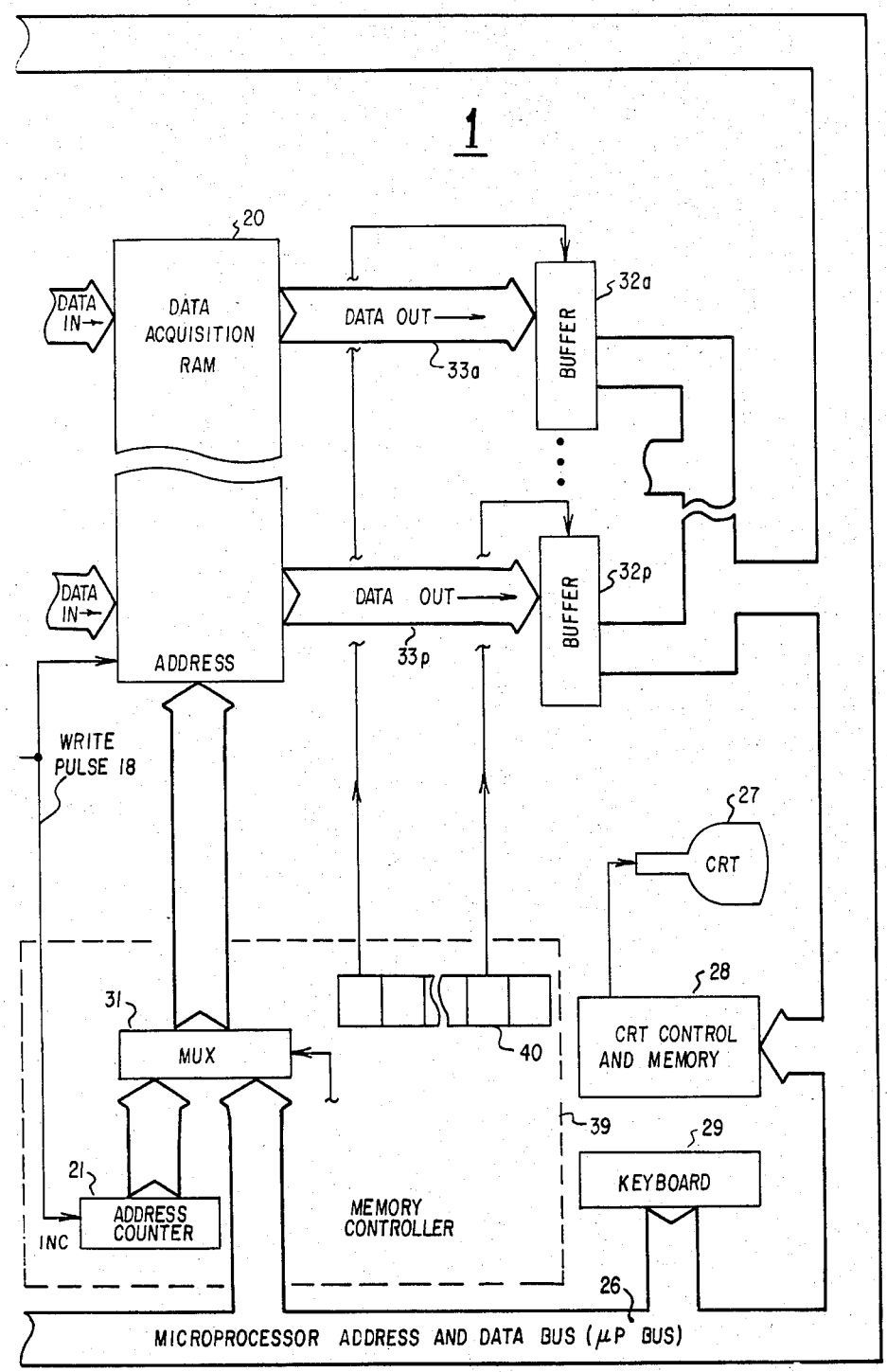

FIG. 1 is a simplified and generalized block diagram of a typical timing analyzer 1 to which the invention may be applied. Both as a convenient point of departure and as an aid in understanding the invention it will be useful to examine the particular timing analyzer 1 shown in FIG. 1 as representative of a typical timing analyzer. In the end it will be clear that the invention is indeed applicable to timing analyzers that differ from that depicted in FIG. 1.

It will also be clear that with suitable minor modifications, to be discussed later, the invention is also readily applicable to logic state analyzers. For brevity the invention is discussed in the context of a timing analyzer. But since the invention involves operations upon trace measurement data gathered into a memory, and since there are certain similarities between captured and stored timing data and logic state data, the general principles of the invention may be applied to either case. In principle, it is not necessary to alter the fundamental data gathering operation of either a timing or logic state analyzer to enable it to cooperate with the invention, so long as the trace data is accumulated in some sort of data acquisition memory. Some formats for the storage of the trace data in that memory may be more convenient for certain purposes than others. However, these are essentially matters of implementation whose effects in a particular case will be clear once the operation of the particular analyzer at hand is understood in light of the following explanation of the operation of the invention.

A plurality of probes is connected to a target system under test (not shown) from which timing waveform data is to be gathered. Typically, the plurality of probes is divided into collections of, say, eight probes in each collection. Subpluralities 3a–h and 3i–p may represent such collections, which are respectively coupled to associated probe pods 4a and 4b. Among other functions, probe pods 4a and 4b allow the user to collectively specify for each individual subplurality of probes selected electrical polarities to represent logical ones and zeros, as well as associated thresholds. The outputs from probe pods 4a and 4b are groups of associated conditioned data signals 6a–h and 6i–p, of which individual signals 6a and 6p are representative.

The various conditioned data signals proceed to a data acquisition unit 7 wherein lines 6a–p are coupled to individual and respectively associated sampling circuits 8a–p. Sampling circuits 8a–p quantize the conditioned data signals according to a signal called sample clock 9 of variable rate preselected in advance and produced by a programmable sample clock generator 10. This produces sampled output signals 11a–p that are each serial bit streams clocked by sample clock 9. The various serial bit streams 11a–p are respectively coupled to individually associated shift registers 12a–p. Each shift register is clocked by sample clock 9 to accept and shift the associated bit stream. In the present preferred embodiment each of shift registers 12a–p is sixteen bits long. Thus, after every sixteen cycles of the signal sample clock the shift registers contain completely new parallel data 13a–p.

The signal sample clock 9 is also coupled to a divide-by-sixteen circuit 14 whose output 15 is a narrow pulse named latch pulse. The various collections of parallel data 13a–p and the latch pulse 15 are coupled to respective sixteen-bit latches 16a–p, and the latch pulse 15 is additionally coupled to a one shot 17 whose output is a pulse 18 named write pulse. Each time the shift registers 12a–p contain completely new data the latch pulse 15 causes the latches 16a–p to capture that new data. The new data remains in the latches 16a–p as the shift registers 12a–p acquire fresh data.

The newly captured groups of data present at the outputs 19a–p of the latches 16a–p and the write pulse 18 are coupled to a data acquisition RAM 20. In the present preferred embodiment the data acquisition RAM 20 has two hundred fifty-six addressable locations. Each location is wide enough to simultaneously accept the total number of bits for all the collections of parallel data 19a–p. For example, if each probe pod had eight probes, and there were two probe pods, then there would be sixteen bit streams, each collected into parallel words of sixteen bits. Thus, each addressable location in the data acquisition RAM would need to store two hundred fifty-six bits. In the present preferred embodiment, therefore, the data acquisition RAM 20 is organized as a 256-bit by 256-location RAM. The write pulse 18 causes the two hundred fifty-six bits to be written into the data acquisition RAM 20, and additionally increments an address counter 21, so that the next write operation will affect the next address.

Because of the compression afforded by the serial-to-parallel conversion the two hundred fifty-six locations each store data for sixteen consecutive samples, so that the logical capacity of the data acquisition RAM 20 is four thousand ninety-six samples of sixteen lines. The obvious benefit of this architectural approach is that the maximum data storage rate needed by the memory 20 is only one sixteenth of the maximum rate of the sample clock 9.

A trigger position controller 22 cooperates with a programmable trigger detector 23 to determine when during the course of a measurement to cease storing sampled data into the data acquisition memory 20. To this end those circuits are responsive to the actions of a microprocessor 24 coupled to a memory 25 of ROM and RAM by a microprocessor address and data bus 26 (which for brevity may be referred to simply as the $\mu$P bus 26). The $\mu$P bus 26 is also coupled to other elements of the timing analyzer 1, as will be described below. In the preferred embodiment the $\mu$P bus 26 is sixteen bits in width, although it will be appreciated that other widths are possible.

A variety of user selectable options are possible in the operation of the timing analyzer 1, some of which will later be described in detail. At present, it will be useful to very briefly consider the general way in which the timing analyzer is controlled by the user. The user specifies the modes of operation and other types of desired behavior through interaction with a control system encoded in the ROM portion of memory 25. In this connection, the control system informs the user of his choices or otherwise prompts him via "soft keys" or other graphical mechanisms displayed upon a CRT 27 driven by a CRT control and memory unit 28 coupled to the $\mu$P bus 26. In response, the user issues commands via a keyboard 29 which is also coupled to the $\mu$P bus 26.

To return now to a general description of the task of controlling the storage of sampled data into the data acquisition RAM 20 during a measurement, the programmable trigger detector 23 and the trigger position controller 22 are each coupled to the $\mu$P bus 26. The detector 23 and controller 22 are each configured by the control system to exhibit particular appropriate operational properties that are based upon information supplied to the control system by the user.

The user specifies the sample rate, which in the present example may range from 2Hz to 400MHz. The microprocessor 24 may program the sample clock generator 10 by any suitable means, such as writing a properly encoded value to a control register (not shown) that is coupled to the $\mu$P bus 26 and that responds as memory for memory cycles directed to a particular address. The contents of the register preset a counter clocked by a stable oscillator of a known and suitably high frequency. When the counter counts up (or perhaps down) to zero a cycle of the signal sample clock 9 is issued and the counter is reset, whereupon the process commences again. In addition, certain bits of the control register can serve as start and stop signals for the sample clock generator 10. Once the rate is set the start signal causes the measurement to commence; the start signal is issued in response to a command from the user to initiate a measurement. The stop signal is issued either in response to a halt command from the user or in response to a mechanism (not shown) within the trigger position controller 22 that determines that both the data acquisition memory 20 has been filled and that a specified amount of data has been stored subsequent to the occurrence of a trigger condition of interest. (The mechanism just described should not be confused with the notion of "halt repetitive execution", described in connection with FIG. 8. In short, the halt just described pertains to completing an individual trace measurement already underway, while the mechanism of FIG. 8 discontinues automatically repeated trace measurements by declining to initiate a new one.)

The trigger condition is, in its simplest form, a pattern in the sampled data and is preselected by the user. When it is detected the sampling and storage of data into the data acquisition memory 20 will end, either immediately, or after a preselected number of subsequent samples. Thus, if the trigger condition is selected to correspond to an episode of interest, the completed measurement will represent either the activities that led up to the episode of interest or the activities occcurring thereafter, or perhaps some of each. The sampled data stored in the memory is called a trace, and the "led up to" case can be called an "end on" trigger (i.e., end the trace upon the occurrence of the trigger). The "occurring thereafter" case can similarly be termed a "start on" trigger, while the remaining case is a "center on" trigger, although the trigger need not be exactly in the center of the trace.

The preselected trigger condition is recognized by a programmable trigger detector 23 coupled to the $\mu$P bus 26. Trigger detector 23 is also coupled to each of the various input signals 6$a$-$p$, as well as to their sampled counterparts 11$a$-$p$. This allows the trigger condition to be expressed in terms of either asynchronous (unsampled) conditions detected immediately and without regard for sample clock 9 or synchronously sampled conditions detected subsequent to sampling with the sampling circuits 8$a$-$p$ and sample clock 9. Any convenient means may be used to actually recognize the preselected trigger condition, which may be as simple as a stated combination of logical ones, zeros and "don't care" bits. Alternatively, it may be more complex and include sequential occurrence criteria. One convenient way to implement the programmable trigger detector 23 would be to use a RAM-based state machine. In a configuration mode the locations in that RAM (not shown) would respond as memory to memory cycles on the $\mu$P bus 26 directed to particular addresses. In response to the specification by the user of the trigger condition the control system writes the proper values into those locations to fashion a state machine that recognizes the desired trigger condition. In a run mode the signals 6$a$-$p$ and 11$a$-$p$ are inputs to the state machine. In a preferred embodiment the programmable trigger detector 23 includes what are essentially two independently programmable detection mechanisms, each responsive to eight sampled input signals. These would correspond to the pattern recognition circuits 3 and 5 in FIGS. 1 and 3 of the aforementioned and incorporated "TIMING ANALYZER WITH COMBINATION TRANSITION AND DURATION TRIGGER." The outputs of these mechanisms are raw trigger signals 30$a$ and 30$b$, which would correspond to instances of trigger signals I and II of FIG. 3 of the incorporated reference. Raw trigger signals 30$a$ and 30$b$ are respectively coupled to a pair of trigger signal qualification circuits 42$a$ and 42$b$ that would correspond to circuits 11 and 18 of the same name in the incorporated reference. The outputs of circuits 42$a$ and 42$b$ are in turn respective qualified trigger signals 43$a$ and 43$b$ (which would correspond to signals 10 and 21 in FIG. 3 of the incorporated reference. Qualified trigger signals 43$a$ and 43$b$ are coupled to a trigger combination selection circuit 44 that is also responsive to the μP bus 26. Circuit 44 would correspond to circuit 19 in FIG. 3 of the incorporated reference. The output of circuit 44 is a doubly qualified trigger signal 45 that would correspond to the signal 20 of the same name in FIG. 3 of "TIMING ANALYZER WITH COMBINATION TRANSITION AND DURATION TRIGGER."

The circuits and signals just mentioned (23, 30a–b, 42a–b, 43a–b, 44 and 45) are capable of implementing powerful transition and duration triggering in a timing analyzer, and they cooperate nicely with the invention to be described. The reader is referred to the incorporated "TIMING ANALYZER WITH COMBINATION TRANSITION AND DURATION TRIGGER" for a full and complete description of transition and duration triggering.

It will be noted, however, that transition and duration triggering, while desirable enhancements to a timing analyzer, are not essential to the operation of the invention to be described. In their absence the signal 45 could simply be a single raw trigger signal originating from programmable trigger detector 23, which in turn simply recognizes a trigger condition upon a single collection of inputs that represents all of the input signals.

However it is generated, trigger signal 45 is sent to the trigger position controller 22, whereupon it affects the subsequent duration of the trace measurement as previously described.

The μP bus 26 is also connected to a memory controller 39 whose function is to direct the storage and removal of data for the data acquisition RAM 20. During the course of a measurement a multiplexer 31 (MUX 31) couples the output of the address counter 21 to the address inputs of the data acquisition RAM 20. Once the measurement is complete, however, MUX 31 is set to couple a portion of the μP bus 26 to those address inputs. In addition, a number of tri-state buffers 32a–p are coupled to various collections 33a–p of output data lines from data acquisition RAM 20, each of which corresponds to a respective collection 19a–p of input data. These buffers 32a–p allow a piecewise read onto the μP bus 26 of the two hundred fifty-six bits of an addressed location within the data acquisition RAM 20. A control register 40 within the memory controller 39 selects which of MUX's 32a–p is allowed to couple its associated output data lines 33a–p onto the μP bus 26. This control register 40 is responsive as memory to memory cycles on the μP bus directed to a particular address. The individual bits of control register 40 are each associated with respective ones of buffers 32a–p.

Because of the serial-to-parallel conversion by the shift registers 12a–p the trace data in the data acquisition RAM 20 is somewhat "scrambled," although in a regular and predictable way. The microprocessor 24 reads the "scrambled" data and builds an unscrambled and readily displayed collection of trace data in the memory portion of the CRT control and memory unit 28, after which an image of the trace can appear upon the CRT 27 in the form of either reconstructed logical waveforms or a tabular list of logical values.

FIG. 2 is an illustration of a CRT display of such reconstructed logical waveforms, including marks "x" and "o" that were automatically and inferentially positioned to conditions of interest in the trace. FIG. 2 is a portion of a trace pertaining to the activity of an example workpiece binary counter named U56. The count appears in increasing significance upon pins one through eight of U56; the eight waveforms have appropriately been labeled U56—Pin—1 through U56—Pin—8. The actual trace is much longer than what is shown. A segment 34 of the indication labeled "Trace memory=" beneath the waveform for U56—Pin—8 shows just what portion of the entire trace is present in the display at the currently selected degree of magnification.

FIG. 2 is a "center on" trace where the trigger condition is the initial entrance into a state where each of signals U56—Pin—1 through U56—Pin—8 is zero. Several cursors appear in the display. The left-most 35 of these is a light vertical line with heavy dashed segments. It is otherwise unlabeled, and is simply "the cursor" as far as the user is concerned. It is for general purpose use. To the right of the user's cursor 35 is another cursor 36 labeled "t" and consisting of only a heavy dashed line. This cursor 36 indicates the location of the specified trigger condition, and cannot be manipulated by the user, except that the trigger specification can be changed and a new measurement subsequently performed. To the right of the trigger cursor 36 is the dashed line mark "x" 37, and further still to the right is the similar mark "o" 38. The display includes legends indicating in units of samples (i.e., cycles of the signal sample clock 11) the positions of the user's cursor 35 and each mark 37 and 38 relative to the trigger cursor 36. The time interval between marks "x" and "o" is also displayed.

Marks "x" 37 and "o" 38 in FIG. 2 were not positioned by a manual inspection of the trace. Instead, the timing analyzer 1 was instructed to examine the contents of the data acquisition memory 20 and place the mark "x" 37 at the first occurrence of entering the state U56—Pin—1 equal to one after the trigger condition. Similarly, the mark "o" 38 was automatically placed at the first occurrence of entering U56—Pin—1 equal to one after mark "x".

In the example of FIG. 2 the trace was captured thirty times; the particular reconstructed waveforms shown are for the last of those. Also shown as part of the display of that trace are some data describing the time interval 41 between marks "x" and "o". According to that data that particular time interval for the associated trace (i.e., the thirtieth one) is seventy nanoseconds. Also shown are the mean value of thirty values (which, after all, might not be the same) and the standard deviation.

Such timing information can be used in at least two ways. First, the statistics can be used to characterize some process or activity that experiences a variable length. Second, it can be used to measure an unchanging time interval with a greater resolution than the period of sample clock 9. This beneficial result is produced by the averaging gained by the repetitive measurements.

At this point the reader is referred to Appendix A, which is a listing of a command file useful in appreciating the example depicted in FIG. 2. A command file is a collection of executable commands that is prepared in advance and used to configure the timing analyzer, establish which of the various modes are in effect, and so forth. While the same activity can be explicitly originated at the keyboard by the user each time those commands are needed, it is often far more convenient to save that activity as text in a named file and then tell the analyzer to execute the commands found in a certain file. Command files can be replicated and edited, so that a frequently convenient way to set up a new measurement is often to copy and then edit an existing command file. In any event, command files are of extreme utility whenever the same measurement set-up is to be used repeatedly over an extended period of time. Command files can be saved on any convenient storage medium available to the timing analyzer. The command file of Appendix A may be thought of as being divided into several parts, each pertaining to a somewhat different function or aspect of timing analyzer set-up and operation.

The command file of Appendix A first establishes a format specification. This is accomplished by issuing a "show format_specification" and subsequently issuing various commands to establish the desired format specification. Format specifications are used to define labels associated with individual probes or collections of probes, as well as to define the correspondence between the logical sense and the electrical value of each signal. The labels are arbitrary, and the user may invent descriptive names that are suggestive to him. In the present example, for instance, one of the inputs is assigned the label "U56_Pin_1"; the label might as easily have been "CNTR_LSB" to signify that the associated probe is connected to the least significant bit of a counter. Any such label is apt to be considerably easier to deal with than having to remember that the far right-hand probe of the pod with the scratched case is the LSB of the counter at U56. Subsequent instructions to the timing analyzer 1 about what to display can be formulated in terms of the labels defined in the format specification.

A label in a format specification can also be assigned to collections of incoming signals. For example, the label "U56_ALL" is assigned to the collection which is probe one bit zero through probe one bit seven. The collection should be thought of as simply the eight bits of a binary value whose symbolic name is "U56_ALL." The label "U56_ALL" does not represent any particular single value; instead, it is a short-hand notation representing the eight-bit variable value that is present at the probes of "pod_1_bit 0 thru pod_1_bit 7."

The command file of Appendix A next establishes a trace specification. The trace specification determines which portion or segment of target system's monitored activity will be retained as the trace. During a measurement the activity of the target system is continuously sampled and stored in the data acquisition RAM 20. This process continues indefinitely until either the measurement is aborted or a trigger condition occurs; the trigger condition is specified in the trace specification. At that time the measurement either halts immediately, or continues for a preselected number of subsequent samples and then halts. The number of subsequent samples is also specified in the trace specification. The effect is to determine where in the final trace the trigger appears. For example, halting the measurement immediately upon detection of the trigger condition makes the trigger appear at the end of the trace (an "end-on trigger"). In the particular example at hand in Appendix A the trigger condition is entering U56_ALL equalling all zeros and the desired trigger position is in the center of the trace. Thus the timing analyzer 1 will consider the data acquisition RAM 20 to be only "half full" when it is detected that U56_ALL (Pod_1_bit 0 thru Pod_1_bit 7) is all zeros, and the measurement will continue for an additional "half a trace memory's worth" of sampled data.

The next specification established by Appendix A is a post processing specification. This specification is used to specify various activities that may be performed upon the sampled data in the trace, subsequent to the conclusion of the preceding trace measurement. In the present example of Appendix A the locations in the trace of marks "x" and "o" are specified, and each such marked location is assigned an optional symbolic name.

The final specification established by the command file of Appendix A is a timing diagram specification. It is here that the user indicates which signals are to appear in the reconstructed waveforms, and in which order. In this example this specification also includes a command to measure the time interval from marks "x" to "o" and display the mean and standard deviation.

The various commands that may be used to control the placement of marks, their use in time interval and occurrence measurements, along with the associated syntaxes, are shown in Appendix B. These commands could appear in a command file or be manually issued by a user at the keyboard at an appropriate time. Once a post processing specification for marks is in effect any previous measurement data that may be in the data acquisition RAM 20 and all subsequent measurement data are displayed with the specified marks. Note that this specifically provides for specifying marks not only before but also *after* a trace measurement has been performed and the associated captured data already stored in the data acquisition RAM 20. Thus, if a certain marking scheme or associated time interval or occurrence measurement proves unproductive or is no longer useful, a different marking scheme or associated measurement can be tried on that same stored data, without the need for repeating the trace measurement. Hence the term "post processing" for the specification in which the marking commands may appear.

Referring now to Appendix B, it will be appreciated that the present embodiment allows six different marks; "a", "b", "c", "d", "o" and "x". Naturally, the particular symbols chosen as the names of the marks, as well as the number of marks, is somewhat arbitrary. Experience has shown that six marks is generally more than an adequate number, and their Roman alphabet names were chosen from symbols already available on a standard keyboard. Other numbers of marks and names therefor are certainly possible.

In an alternate embodiment a mark may represent a region where some condition is met, rather than simply a point. Such a region could be the portion of a waveform diagram actually meeting a duration requirement associated with some pattern among the signals. In such an embodiment a useful way to represent such a mark would be with a change of color in the presentation of the trace. Of course, a region could be represented by a series of consecutive symbols, as well. Further, if a mark represents a condition that has a duration, it may be a matter of choice as to whether the mark appears in the trace presentation at the onset or at the conclusion of the condition.

The syntaxes shown in Appendix B are accompanied by comments, and are generally self-explanatory. The following is a descriptive summary of the general points of interest that will be appreciated following a study of Appendix B. In those descriptions the terms "expressly" and "inferentially" are to be construed as follows. A mark is expressly positioned when the user already has identified the spot in the trace where that mark is to go, and in effect says, "Put that mark here." Expressly positioning a mark is essentially manual placement of that mark without the use of automatic searching for a condition in the trace data. In contrast, a mark is inferentially placed when the user specifies some condition of interest in the data as the location of the mark. The specification is essentially symbolic, defined as a logical relationship in terms of the names given to the data signals, and may incorporate greater or less degrees of qualification. Within a given trace measurement the specification may be satisfied once, many times, or perhaps not at all. The lack of foreknowledge about the exact location(s) in the trace meeting the specified condition is central to the difference between express and inferential placement. In the latter case the user is essentially saying, "Search the trace for these conditions and automatically place the mark at a location that meets them." Generally speaking, the user won't know in advance where that is, or if he has a general idea, he won't know exactly.

The syntaxes of Appendix B are tailored for use with a timing analyzer, and certain changes may be desirable if the invention is to be implemented in a logic state analyzer. For instance, it is not uncommon for a logic state analyzer to present only a tabular trace with no reconstructed waveforms. Further, one of the virtues of a modern logic state analyzer is its ability to be very selective about which states are admitted to the trace, as well as about what conditions will serve as a trigger. It is quite possible, and indeed likely, that consecutive elements of the resulting trace do not correspond to equal increments along a time axis. Instead, they are most apt to represent state data that meets certain defined criteria and whose intervening time intervals generally cannot be predicted. The foregoing may suggest some minor changes in various ones of the marking specifications to better accomodate the circumstances of a logic state analyzer. Nevertheless, the operation of such a logic state analyzer would still include the making of a trace measurement and then examining the resulting data with qualified inferentially placed marks located according to pre-defined logical relationships between the elements of the trace. Such marks could appear in their own column of the tabular trace list.

Referring now to Appendix B:

Any mark may be "turned off". All instances of the specified mark are affected. A mark that is turned off is not deleted, but merely rendered invisible; whether mark b is on or off does not affect any other mark whose definition uses the notion "after mark b". That is, a mark that is off is "still there", but simply can't be seen. Likewise, any mark may be "turned on". All instances of the specified mark are affected. Turning a mark back on renders it visible again.

Any mark may be expressly positioned at the location of the trigger cursor 36 or at the location of the user's cursor 35. In addition, a symbolic name may be associated with such a mark.

Any mark may be expressly positioned to the location in the trace that corresponds to a numerically specified one of the four thousand ninety-six samples comprising the trace.

Any mark may be inferentially positioned to the first occurrence of a specified event, which may optionally be required to be either before or after a different mark, specified cursor or sample number.

Marks "a" through "d" may be inferentially positioned at each occurrence of a specified event, which may optionally be required to be either before or after a different mark, specified cursor or sample number. (Marks "x" and "o" are excluded from this command to prevent inadvertent multiple "x's" or "o's." The statistics for count and time interval are performed upon the interval "x to o" and such multiple marks would introduce ambiguity.)

The specified event mentioned in the preceding two paragraphs may include entering or leaving any specified pattern in the signals being monitored, a duration criterion for any such pattern, any transition in the value of any labeled (collection of) input signal(s), and various glitch criteria.

A duration requirement for a timing analyzer would generally be thought of as the question, "Does this signal or this combination of signals occur for the associated duration?" Any signals not part of the question are simply absent from the question and its syntactical representation; they don't even need to appear as "don't care" symbols, although it is conceivable that they could. On the other hand, in a logic state analyzer the notion of duration may well involve "don't cares," perhaps in the least significant portion of an address. (Such a thing may depend upon the amount of "formatting" and "labelling" that is available.) Don't care symbols in the definition of the condition whose duration is being checked would amount to asking if consecutive states in the trace met a range condition for the specified duration. It is also possible that one could ask, "Does this particular state (expressed without don't cares) meet a duration requirement?" The latter case may require the expectation that the same state appears consecutively in the trace, and that each element in the trace have an associated time axis value. Such associated time values are conventional; as for example in the Hewlett-Packard model 1610 Logic State Analyzer.

In addition, once the marks have been specified:

The time interval from marks "x" to "o" can be measured and displayed as part of the trace.

The total number of any of marks "a" through "d" between marks "x" and "o" can be counted and displayed as part of the trace.

In further addition, up to one thousand consecutively performed repetitive trace measurements may be performed automatically. Subsequent to this repetitive execution the minimum, maximum and mean values, as well as the standard deviation, are variously available for the measured time interval or measured count associated with the measurement being executed repetitively. The halt_repetitive_execution commands are discussed in detail below, after some examples and discussion of various other commands and operational properties of the analyzer.

To summarize, FIG. 2 illustrates the application of various format, trace and post processing specifications in a timing analyzer 1 to the waveforms generated by a binary workpiece counter called U56. The various specifications are established by the command file of Appendix A. The post processing specification of that command file positions the marks that appear in FIG. 2 by application of the various commands described in Appendix B.

The establishment of particular format, trace and post processing specifications alters certain internal properties of the timing analyzer 1, as previously described. In a certain sense, changing any one of the specifications causes the timing analyzer 1 to operate differently, and the user must have a way to determine at any given time by noninvasive inspection what various modes of operation are currently in effect; he shouldn't be expected to simply memorize or write down the various specifications previously entered. To this end the timing analyzer 1 itself displays or prints upon a request by the user summaries of the specifications currently in effect. Appendices C1, C2 and C3 are such summaries for the example in connection with Appendix A and FIG. 2. For example, Appendix C1 is a tabular representation of the format specification established by the command file of Appendix A. The information of Appendix C1 may be viewed upon the CRT display 27 by executing the command show format specification. The summaries of the other specifications are accessible through other similar commands corresponding to each such specification; e.g., show post_process_specification.

Turning now to FIG. 3, that figure illustrates yet another captured trace pertaining to the workpiece counter U56, but marked with multiple instances of various marks. FIG. 3 also shows certain further uses of the commands set out in Appendix B, including a result of using one of the halt_repetitive_execution commands that are discussed somewhat later. In the interest of brevity, the associated command file has been omitted, but Appendices D1, D2 and D3 record the resulting format, trace and post process specifications, respectively.

Because of the nature of the trace and post process specifications associated with FIG. 3, not all instances of the marks are visible in that figure, although they are still present in the trace data. The selected degree of magnification and the limited width of the CRT 27 combine to produce this situation. An alternative to the reconstructed waveform diagrams of FIG. 3 is the trace list of Appendix E, which by virtue of its tabular format is not limited to the width of the CRT. And while it is true that the length of the trace list exceeds the height of the display, it is simply an ordinary file of ASCII characters which may be vertically scrolled on the CRT with relative ease, or simply printed in its entirety on a hard copy device.

Not only does FIG. 3 illustrate multiple instances of marks "a" through "d" between marks "x" and "o", it also illustrates the displayed result for counting the number of marks "a" through "d" between marks "x" and "o". The (abbreviated) trace list in Appendix E perhaps gives a better idea of how the counted marks may be distributed through the trace.

To locate all the marks in Appendix E one would have to examine the entire tabular listing, which if presented in pages of sixty-four lines each would require sixty-four pages. Even at one second per page it would take over a minute just to observe all the marks, to say nothing of comparing various results and pondering their meanings. Appendices F1 and F2 offer an improvement to this situation by reducing the tabular trace list to just those samples that were marked.

Appendix F1 is identical to Appendix D3 except that it includes the command PROCESS_FOR-DATA marked. This command condenses the trace measurement to a tabular listing that includes only those samples that were marked. Appendix F2 is the resulting tabular listing.

The ability to count marks, as illustrated in FIG. 3 and Appendices D and E is useful for the following purpose. One can use marks "x" and "o" to define a window in time, while using marks "a" through "d" as required to identify event(s) of interest. The illustrated counting operation then reveals how many times the event(s) occurred during the window.

Figure 4:
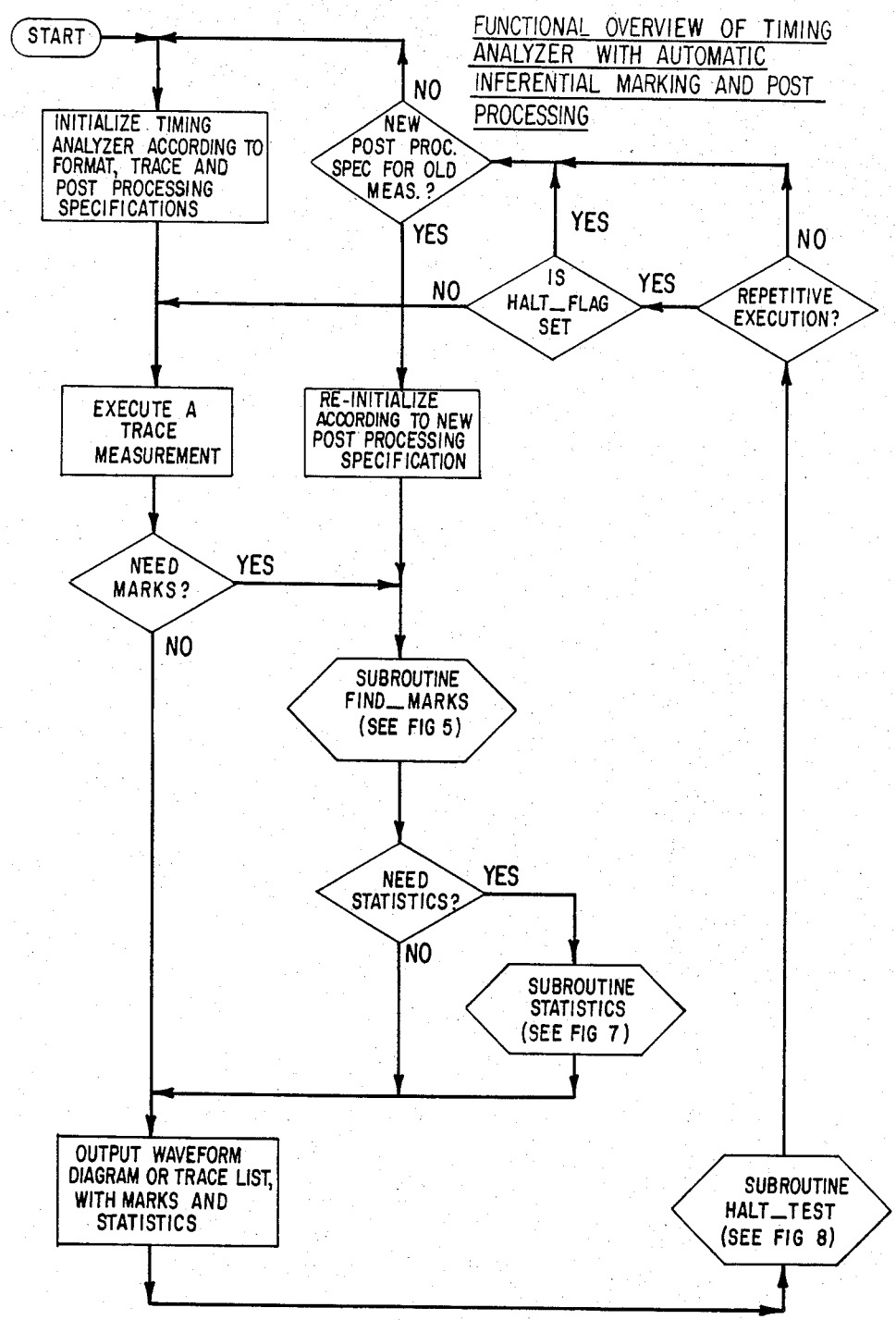
FIG. 4 is a flow chart providing a functional overview of the process of automatically and inferential qualification marking a captured trace according to a post processing specification for the timing analyzer of FIG. 1.

Referring now to FIG. 4, shown there is a simplified and generalized flow chart of that aspect of timing analyzer operation pertaining to automatic marking and post processing. The flow chart of FIG. 4 is a functional overview setting out certain relationships between various activities of the user and of the timing analyzer 1. Certain details contingent upon how a specific system might be implemented have been omitted in the interests of clarity and brevity. For example, there is no "idling mechanism" corresponding to commands from the user to execute or halt a series of one or more measurements. Likewise, no details are shown in connection with how the user actually interacts with the timing analyzer through the keyboard 29 and display 28 to enter the various specifications. Instead, the flow chart concentrates on the results, and serves as a convenient introduction to the activities of qualified inferential marking and post processing, each of which will be examined in some detail.

According to the flow chart of FIG. 4, the user enters the format, trace and post processing specifications pertaining to the measurement he intends to make. Although such is not shown explicitly, the post processing specification might be omitted at this point, and may be supplied later. Following the specifications the timing analyzer executes a trace measurement. That is, it makes the four thousand ninety-six consecutive samples and loads the data acquisition RAM 20 as previously described.

Following completion of the trace measurement the control system ascertains the need for marks. If the user has not requested any marks in the trace the control system proceeds to prepare and output the trace directly, without inserting any marks. If, on the other hand, the user has requested automatic marking then a subroutine named FIND_MARKS performs that operation. The FIND_MARKS subroutine is the subject of FIG. 5 and the associated discussion thereof.

Once any requested marks have been automatically placed into the trace the control system determines if any statistics are to be found. If not, the control system proceeds with the preparation and output of the trace.

Following the output of the trace the control system calls a subroutine HALT_TEST whose function is to control the value of a flag HALT_FLAG, based upon whether or not an invoked halt_repetitive_execution command is satisfied. Those commands allow a series of consecutive and repetitive trace measurements that are automatically performed to be discontinued at the conclusion of a trace measurement that meets the criteria of such a command. Those commands are discussed in detail at a later point in this disclosure. The subroutine HALT_TEST is also discussed later (in connection with FIG. 8). In brief, HALT_TEST determines if repetitive execution is to be discontinued. If so, it sets the flag HALT_FLAG true; otherwise, HALT_FLAG is set false.

Following subroutine HALT_TEST the control system determines if repetitive execution is in effect. If so, then unless HALT_FLAG is set another trace measurement is automatically executed without delay, repeating the process described to this point. If HALT_FLAG is set then repetitive execution is discontinued. If repetitive execution is either not in use or is complete the control system determines if a new post process specification exists for a previously completed measurement. If such does not exist the control system is receptive to new specifications in anticipation of an entirely new measurement. However, if there is a new post process specification then the timing analyzer is re-initialized according to that new specification and the subroutine FIND_MARKS is invoked, followed by the output of a new waveform diagram or trace list, etc. It is through this mechanism that the user can re-examine old data according to new marking schemes, and do so without re-running the measurement. It will be noted that whatever any "idling loop" might be like at the conclusion of an instance of single or repetitive execution, such an idling loop would likely include the "NEW POST PROCESS SPECIFICATION FOR OLD MEASUREMENT?" qualifier that is the subject of the preceding discussion.

Figure 5:
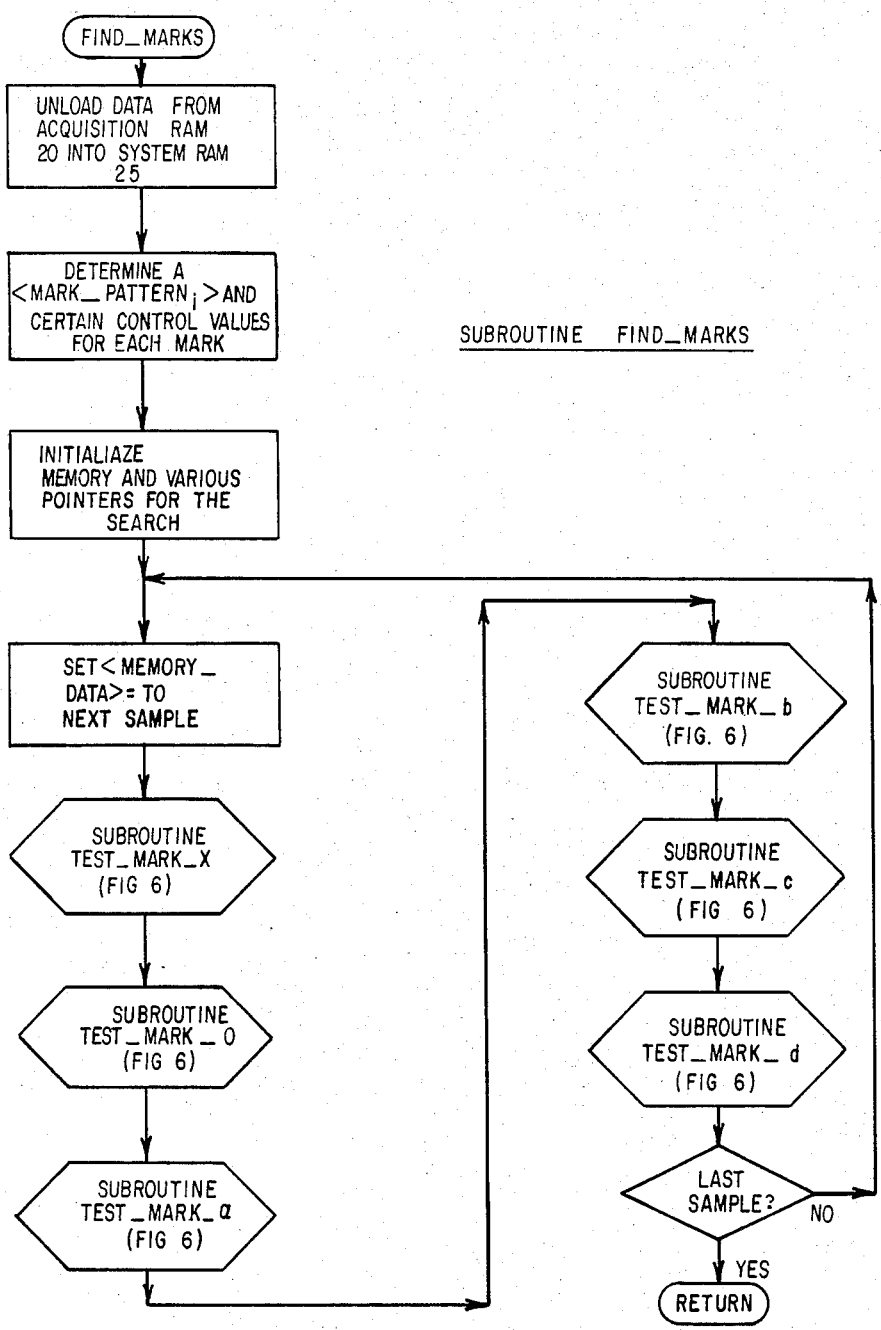
FIG. 5 is a flow chart of a subroutine FIND_MARKS used in the flow chart of FIG. 4 and which tests each sample in the captured trace for meeting the definitions of each defined mark.

FIG. 5 is a flow chart of the subroutine FIND_MARKS. That subroutine examines each sample within a trace measurement and inserts the appropriate marks into the trace.

The first action taken by FIND_MARKS is to unload the acquired data that is in the data acquisition RAM 20 into the RAM portion of the system memory 25. In the process the information is reformatted into four thousand ninety-six sixteen-bit words, each bit of which corresponds to one of the sixteen sampled signals from the system under test. A one represents a high signal, while a zero represents a low signal.

Next, FIND_MARKS determines, for each active mark (i.e., only those marks used by the user) the pattern in the sampled data which is needed to satisfy the definition of the mark. These patterns are determined according to the MARK commands of Appendix B and are written into variables named MARK_PATTERN_x through MARK_PATTERN_d. For brevity and ease of notation we shall occasionally symbolize all or a portion of that collection as simply MARK_PATTERN$_i$, with the understanding that i=x,o,a,b,c,d as required. Associated with each MARK_PATTERN$_i$ are two control values called MANY_ENOUGH$_i$ and FEW_ENOUGH$_i$. As is shown below in connection with FIG. 6, these three variables define for each mark what conditions in the sampled data are to be identified by that mark. If the automatic placement of marks were limited to mere recognition of a pattern, the MARK_PATTERN$_i$ would by themselves be adequate. But qualifying marks according to such events as entering or leaving a pattern, and according to duration criteria, requires extra information in addition to the pattern of the sample currently under consideration. For each mark that extra information will be developed and stored in MANY_ENOUGH$_i$ and FEW_ENOUGH$_i$. In summary, at this point in the flow chart FIND_MARKS determines exactly what specific values of MARK_PATTERN$_i$, MANY_ENOUGH$_i$ and FEW_ENOUGH$_i$ must be satisfied during the upcoming sample-by-sample inspection of the data in order for a sample to receive a mark.

FIND_MARKS then initializes various locations in RAM 25. Included therein are a table named MARK_TABLE whose contents will be the names and locations of any marks found to belong in the trace (it is an entry in this table that actually causes a mark to appear in the output trace), a sample pointer that defines which sample is under consideration during the search, as well as certain other variables, among which are MATCH_COUNT$_i$. These latter are set to zero.

At this point FIND_MARKS enters a loop that examines each of the four thousand ninety-six samples for each mark. A variable MEMORY_DATA is loaded with the value for the first (or next) sample. MEMORY_DATA is then tested in turn by each of subroutines TEST_MARK_x through TEST_MARK_d. In the present embodiment it was preferred to have six separate subroutines TEST_MARK_x through TEST_MARK_d, rather than have a single routine TEST_MARK_i called by a loop that selects and passes a mark-identifying parameter. The choice between the two approaches will depend upon how conveniently the programming tools in use support such indexing, how efficient the resulting code is, how fast it executes, etc., as well as the personal tastes of the programmer in these matters of style. In the present embodiment speed of execution was very important, indexing was somewhat inconvenient and there was generally sufficient off-line storage for code segments on the system disc, so the decision was made to implement what are essentially six different copies of the same routine. We shall examine that routine in connection with FIG. 6, and shall take the liberty of calling it TEST_MARK_i, anyway. However implemented and named, it is the TEST_MARK subroutine that controls the value of MATCH_COUNT$_i$, tests that value and MEMORY_DATA against the predetermined values for MANY_ENOUGH$_i$, FEW_ENOUGH$_i$ and MARK_PATTERN$_i$ to determine whether or not to make an entry into MARK_TABLE.

After a sample has been tested for each active mark FIND_MARKS checks to see if that was the last of the four thousand ninety-six samples. If so, the subroutine has reached completion and executes a return. Otherwise, it loops back to get the next sample and then tests it for marks.

Figure 6:
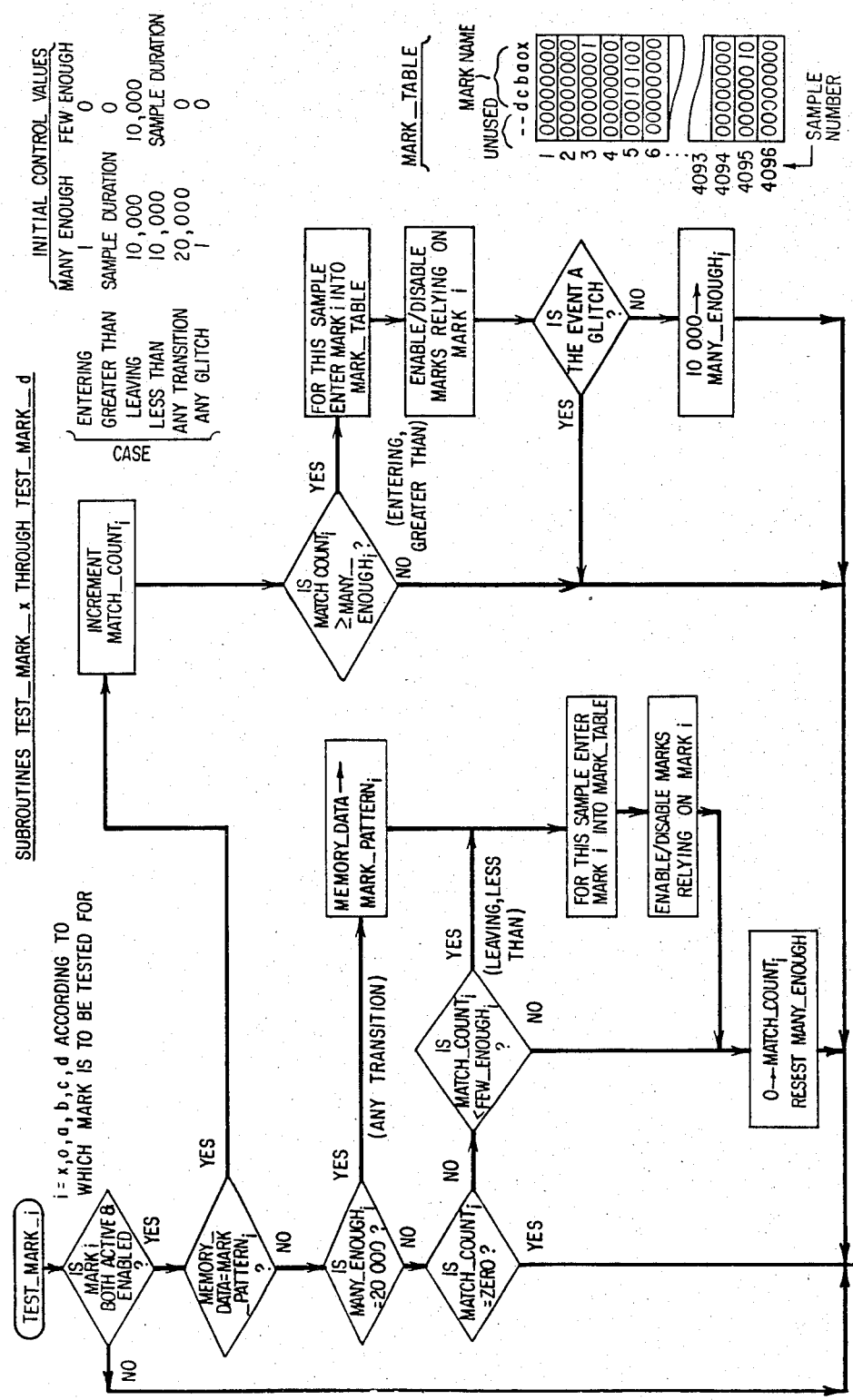
FIG. 6 is a flow chart of a subroutine TEST_MARK used in the flow chart of FIG. 5 and which tests a given sample in the captured trace for meeting the particular definition of a specified mark.

Referring now to FIG. 6, shown there is a simplified flow chart of the subroutine TEST_MARK. The first activity is to decide whether to actually test for the mark or not. There is no point in actually testing the current sample (held in MEMORY_DATA) unless the mark under consideration is both active (the user has mentioned it in a specification) and enabled (the mark is not contingent upon another mark, or if it is, then the contingency is met). Unless both these conditions are satisfied TEST_MARK proceeds to an immediate conclusion. That is, the path through the flow chart is NO, . . . .

If the mark under consideration is both active and enabled the next test is to see if MEMORY_DATA (the sample currently under consideration) equals MARK_PATTERN$_i$. That is, neglecting the transitional or dynamic aspects of the various entering, leaving and duration cases, etc., does the current sample otherwise "fit the template" for the definition of the mark? If it does, then the possibility exists that either an entering or greater than condition may be satisfied. As part of the mechanism for distinguishing between the two, a counter MATCH_COUNT$_i$ is immediately incremented each time a pattern match is detected (any YES, YES, . . . path). MATCH_COUNT$_i$ starts at zero, so upon encountering a specified pattern for the first time MATCH_COUNT$_i$ will be incremented to one prior to being tested.

When TEST_MARK is to find the entering condition the control value MANY_ENOUGH$_i$ will have previously been set to one. MANY_ENOUGH$_i$ is compared to MATCH_COUNT$_i$ immediately after the latter is incremented. The test asks if the number of pattern matches is greater than or equal to the control value. In the entering case the two will be equal, as explained above. But in the greater than case the test will not be met until MATCH_COUNT$_i$ is incremented to a high enough value to equal or exceed an appropriately high control value for MANY_ENOUGH$_i$. The idea is that if the required duration is one hundred microseconds and the sample clock frequency is 1.0 MH$_z$, then an actual duration exceeding about one hundred microseconds will engender one hundred consecutive increments of MATCH_COUNT$_i$. That is, one increment for each time TEST_MARK$_i$ is used to test for mark$_i$. The control system determines how high to set MANY_ENOUGH$_i$ to represent a given duration with a particular frequency for sample clock. If the actual duration of the pattern match is indeed long enough then MATCH_COUNT$_i$ will eventually become greater than or equal to MANY_COUNT$_i$ and the qualifier will be met.

Once the qualifier is met the YES, YES, YES, ... path makes an entry in MARK_TABLE and, based upon the mark just found, enables or disables any other marks, as required.

Next, if the event is not a glitch, MANY_ENOUGH$_i$ is set to the impossibly high value of ten thousand to (at least temporarily) disable the dectection mechanism just discussed. This keeps a continuing match from producing any further entries in MARK_TABLE. Another entering or greater than condition can be detected, but there must first be detection of an intervening leaving condition. Such intervening detection will reset MANY_ENOUGH$_i$ back to its original control value.

If the event was a glitch the disabling mechanism just discussed is not used. Generally, each glitch is a stand alone event that may be of interest in and of itself, and three consecutive glitches on a line produce three consecutive marks. There is no "mark on entering a string of consecutive glitches;" each glitch will produce a corresponding entry in MARK_TABLE.

The last several paragraphs have assumed that the qualifier MATCH_COUNT$_i \geq$ MANY_ENOUGH$_i$ is met (any YES, YES, YES, ... path). There are two ways that it might not be met (YES, YES, NO,...). The first is that the pattern of interest is present, has already been entered with an earlier sample, but that a required duration has not yet been achieved. The second is the same except that the duration has been achieved, detected and is being exceeded. Either way represents a case where a pattern match occurs but no immediate activity is required, save for incrementing MATCH_COUNT$_i$.

Now suppose that upon entry into TEST_MARK, MEMORY_DATA does not equal MARK_PATTERN$_i$ (YES, NO,...). If this is the case the next test is to determine if the any transition criterion is in effect. An impossibly high value of twenty thousand for MANY_ENOUGH$_i$ serves as a flag for this situation. The transition condition itself is detected by arranging for MARK_PATTERN$_i$ to always represent the previous value of MEMORY_DATA. In this way the second qualifier effectively asks, "Does the new sample equal the previous one?" If it doesn't then there was a transition. For our present assumptions that is indeed the case. Accordingly, the preset value of MEMORY_DATA is stored in MARK_PATTERN$_i$, an entry is made in MARK_TABLE and any necessary enabling or disabling of other marks is performed.

Subsequent samples that do not represent a transition will produce a pattern match, similar to the entering or greater than conditions. But MANY_ENOUGH$_i$ was previously set to such a large value (twenty thousand) that no marks can ever be stored in MARK_TABLE by going that way in the flow chart. But the next transition will cause MEMORY_DATA to be unequal to MARK_PATTERN$_i$, which will again record a mark, as previously described.

Following an entry of a mark into MARK_TABLE on account of any transition MATCH_COUNT$_i$ is set back to zero and MANY_ENOUGH$_i$ is reset to its original value of twenty thousand (it hasn't changed from that). These actions are benign, and are there for other situations considered below.

MEMORY_DATA and MARK_PATTERN$_i$ might be unequal and MANY_ENOUGH$_i$ could be unequal to twenty thousand. That is, there is no match and the any transition case is not of interest (YES, NO, NO,...). One way for this to happen is simply for the pattern needed for that mark to never occur (or at least not up to this point in the trace measurement). This particular case is readily distinguished since MATCH_COUNT$_i$ will remain at zero (it is only incremented subsequent to a match and it starts out equal to zero, remember). That, then, is the significance of the qualifier IS MATCH_COUNT$_i$ =ZERO. If the answer is yes (YES, NO, NO, YES) then the case just mentioned is at hand, and no action is necessary during this pass through TEST_MARK.

However, if MATCH_COUNT$_i$ is not equal to zero (YES, NO, NO, NO, ...) then there was an earlier match but now there is not. That is, (providing previous entering/leaving pairs are ignored) the flow chart has detected the leaving condition. Now, the difference between the leaving and duration less than conditions is discernable by requiring that the pattern match not last too long. That is what the control value FEW_ENOUGH$_i$ is for, and it operates in a manner somewhat similar to MANY_ENOUGH$_i$.

Consider the case of leaving for a moment. Both MANY_ENOUGH$_i$ and FEW_ENOUGH$_i$ are set to the impossibly high value of ten thousand. The high value of MANY_ENOUGH$_i$ prevents actualization of any entering or greater than case (YES, YES, NO). MATCH_COUNT$_i$ will still be incremented upon agreement between MEMORY_DATA and MARK_PATTERN$_i$, but can never attain more than a fraction of the value ten thousand. So even though a sought for pattern is "entered" and even though it may obtain for an arbitrarily long duration, nothing happens until the pattern no longer matches. At that point the path through the flow chart will be YES, NO, NO, NO, YES. The last answer has to be YES since there is no way the number of pattern matches can approach ten thousand. After an entry is made in MARK_TABLE and the other marks are enabled and disabled as needed, MATCH_COUNT$_i$ is set to zero. Assuming the pattern match remains unmet this changes the path through the flow chart to YES, NO, NO, YES, preventing any further entries into MARK_TABLE until after there has been another pattern match and MATCH_COUNT$_i$ has been incremented away from zero.

The less than case operates in a similar manner except that the qualifier IS MATCH_COUNT$_i$ <FEW_ENOUGH$_i$ operates to prevent entry into that portion of the flow chart that makes an entry into MARK_TABLE unless the number of consecutive matches preceding the "leaving" is a low enough number. That is, unless the duration of the just concluded pattern match is short enough. If that condition is met an entry is made into MARK_TABLE, otherwise it is not. Either way, the episode is concluded by resetting MATCH_COUNT$_i$ to zero, which prevents any possibility of another leaving or less than situation until after at least one subsequent intervening pattern match.

The preceding explanation of FIG. 6 is specific to a particular timing analyzer, and assumes that the duration conditions of greater than and less than can be determined by the number of consecutive pattern matches. This assumption is made possible by the known regular and periodic nature of the sampling. Such would typically not be the case for a logic state analyzer, where the time interval between consecutive elements of the trace generally cannot be predicted. (It might be predictable, but at the expense of sacrificing a feature known as storage qualification, whereby a state is not stored unless it satisfies some qualifying condition, such as being within a certain range of values.) Nevertheless, the notion of inferential marking according to duration can still be applied to a logic state analyzer if it appends time axis information to each state stored as part of the trace, as is not uncommon. The flow chart of FIG. 6 would of course change accordingly; it would determine duration criteria by direct comparison of the associated time axis values.

FIG. 6 also shows an implementation of MARK_TABLE. The table is a series of four thousand ninety-six bytes, each of whose six least significant bits is associated with a particular mark. Each byte corresponds to a sample in the trace measurement. A one indicates that the associated mark is to appear at that sample number in the presentation of the trace.

The control system includes a routine that creates the presentation of the trace, whether that is a trace list or is a reconstructed waveform diagram. As that routine extracts the "unscrambled" trace data samples from the RAM 25 it also checks the associated byte of MARK_TABLE and adds to the presentation any marks that are indicated.

MARK_TABLE has been shown as a column of bytes, as though a word of memory were only eight bits wide. In the present preferred timing analyzer embodiment memory words are sixteen bits in width, and MARK_TABLE is packed accordingly, with two entries per word.

In one alternate arrangement MARK_TABLE may be of either a variable length or a fixed length shorter than the number of samples in the trace measurement. The width of the entries is wider, say, sixteen bits. Each entry into the table has two portions. A first portion identifies the sample number, and the second portion identifies one or more marks associated with that sample. If the second portion has sufficiently many bits, it may encode a multiplicity of marks; otherwise multiple marks at the same sample can be represented by multiple entries into MARK_TABLE, of which each is for different marks.

In another alternate arrangement there is no separate MARK_TABLE and the data acquisition memory is made wider by the number of bits needed to encode the marks. The various marks are then encoded in those extra bits upon completion of the trace measurement.

Figure 7:
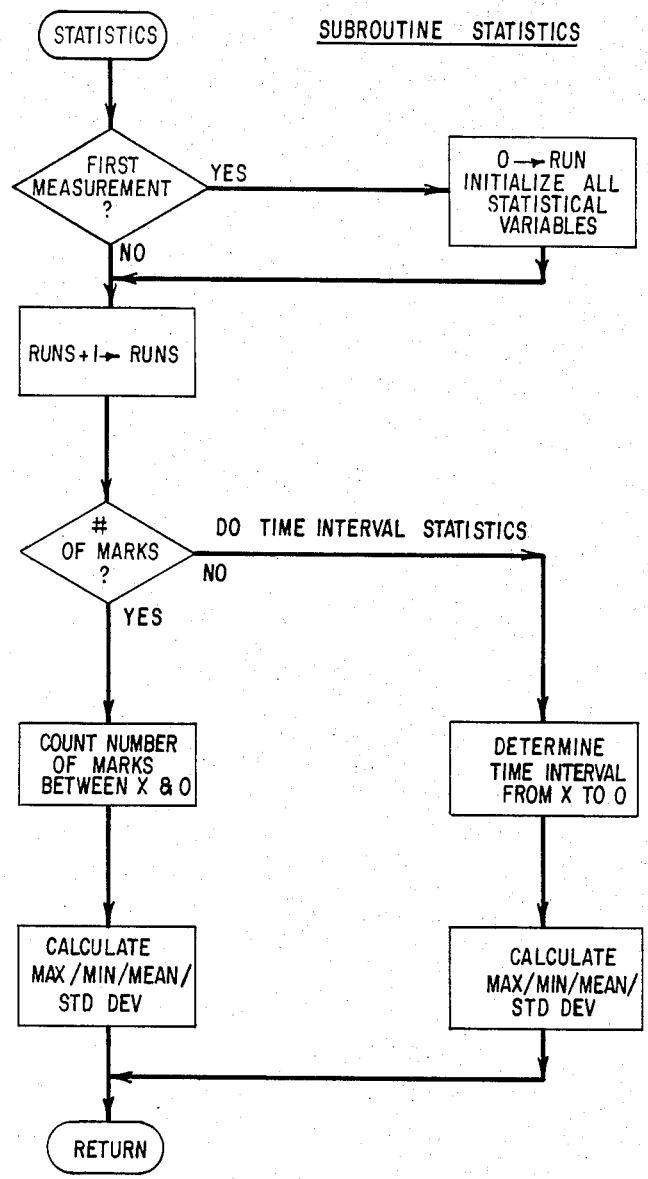
FIG. 7 is a flow chart of a subroutine STATISTICS used in the flow chart of FIG. 4 and which finds certain statistics of interest upon time interval or count measurements associated with marks placed inferentially during automatically repeated consecutive trace measurements.

FIG. 7 is a simplified flow chart of the subroutine STATISTICS. The first activity is to determine if this particular use of STATISTICS is for the first in a series of automatically performed repetitive trace measurements. If so, then a counter named RUNS is set to zero and all of the variables associated with the various statistics are initialized. In all cases, whether for the first measurement or not, RUNS is then incremented. RUNS represents the number of consecutive automatic trace measurements performed so far in the current series. Next, the subroutine decides which type of measurement to extract from the data in MARK_TABLE. Following that it extracts the needed measurement (a count or a time interval) and calculates the cumulative statistics of maximum value, minimum value, mean value and standard deviation.

Referring again to Appendix B and to FIG. 3, the reader's attention is directed to the various halt_repetitive_execution commands. These allow an ongoing series of repetitively performed trace measurements to be concluded upon the detection in a just completed trace measurement of any of the following conditions:

1. The time between marks x and o is greater or less than a specified duration of time.
2. The number of intervening marks between marks x and o is greater or less than a specified number.
3. A sequence of marks placed into the trace measurement satisfies a specified sequence of up to four marks in length.
4. The trace measurement just completed is the last of a specified number of repetitively performed "runs;" each run is an individual trace measurement.

Conditions one through three above are useful in extending the triggering capabilities of the analyzer. They allow the detection, subsequent to the conclusion of a trace measurement, of conditions therein which are impractical to detect in real time and at high speed while the trace measurement is under way. Suppose, for example, that each of marks, a, b, c and d represented four different patterns, each with its own duration qualification. A halt of repetitive execution upon detecting the sequence of marks a, b, c, d would capture a sequence of events that cannot be detected even by the sequential trigger mechanisms of the most sophisticated prior art timing or logic state analyzer.

There is a trade off, of course. The sequential trigger in, say, a logic state analyzer operates in real time and at high speed, with no "dead time." The present mechanism operates during a time interval between the conclusion of one trace measurement and the beginning of another. As such, target system activity during that period of time is excluded from consideration. This gives the extended triggering of the halt_repetitive_execution commands a sampling or statistical nature, in that it is not guaranteed that any particular instance of activity will be captured. However, there is certainly a chance that it will be, and this generally means only that it may take a longer period of time for the overall measurement activity to produce the desired results. Thus, there remains the *advantage* that the condition being sought is allowed to happen in the target system at the very highest speeds at which the analyzer operates, and yet still be found.

The halt_repetitive_execution commands can be used to overcome certain other practical limitations in the triggering of analyzers, as well. For example, practical limitations in the timing portions of timing analyzer trigger circuits may limit what durations are detectable to a fixed collection of values, much as the calibrated attenuator of an oscilloscope offers only fixed steps. Thus, a 1, 2, 5, 10 sequence of values for duration may allow triggering an individual trace measurement on an event of duration exceeding 5 ns, 50 ns, 500 ns, 5 s, etc., but does not allow the specification of a duralion such as 675 ns. (The reader is referrred to the incorporated reference for an example of such a trigger circuit for a timing analyzer.) Such a limitation is overcome by a halt_repetitive_execution command specifying greater than 675 ns for the associated pattern or signal (i.e., use of condition 1 above). The trigger condition for each individual trace measurement might be a center on trace for the signal or pattern of interest exceeding 500 ns. Thus, the timing analyzer will run repeatedly, capturing trace measurements containing events that are potentially, but not necessarily, of interest. The analyzer would halt when an event that definitely was of interest has been detected in a captured trace measurement.

Figure 8:
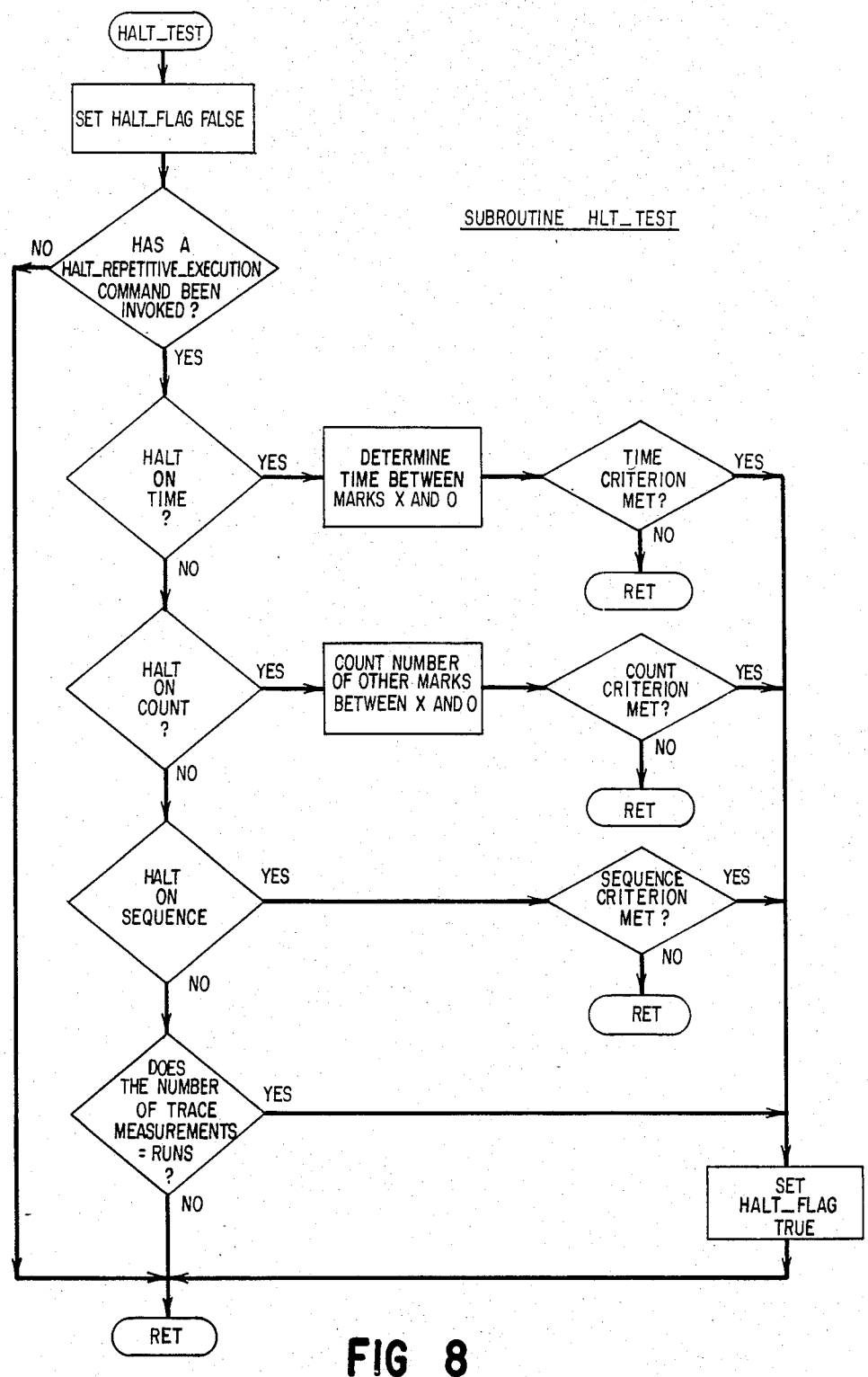
FIG. 8 is a flow chart of a subroutine HALT_TEST used in the flow chart of FIG. 4 and which looks for user specified conditions within each completed trace measurement to determine whether or not to discontinue automatically repeated consecutive trace measurements.

FIG. 8 is a simplified flow Chart of a routine HALT_TEST which is used in FIG. 4 and determines whether or not to halt an ongoing series of repetitive trace measurements in response to an invoked halt_repetitive_execution command.

HALT_TEST first sets a flag HALT_FLAG false, after which it determines if a halt_repetitive_execution command is currently invoked. If none is, no further activity is required and HALT_TEST returns to the calling routine of FIG. 4. If a halt_repetitive_execution command is in effect then which type of condition is in force is determined by a series of qualifiers, each of which is associated with a further test to determine if the halt condition is met. If it is HALT_FLAG is set true, which affects the operation of the anlyzer according to the previous explanation of FIG. 4.

APPENDIX A

```
show format_specification
delete     all_labels
define     U56_Pin_1    pod_1_bit    0    logic_polarity positive_true
define     U56_Pin_2    pod_1_bit    1    logic_polarity positive_true
define     U56_Pin_3    pod_1_bit    2    logic_polarity positive_true
define     U56_Pin_4    pod_1_bit    3    logic_polarity positive_true
define     U56_Pin_5    pod_1_bit    4    logic_polarity positive_true
define     U56_Pin_6    pod_1_bit    5    logic_polarity positive_true
define     U56_Pin_7    pod_1_bit    6    logic_polarity positive_true
define     U56_Pin_8    pod_1_bit    7    logic_polarity positive_true
define     U56_ALL      pod_1_bit    0    thru pod_1_bit 7
           logic_polarity positive_true
show trace_specification
trigger on entering U56_ALL = 000
trigger position_is center_of_trace
show post_process_specification
mark    x    on_first_occurrence_of entering U56_Pin_1 = 1 after trigger
             named START
mark    o    on_first_occurrence_of entering U56_Pin_1 = 1 after mark_x
             named STOP
show timing_diagram
display U56_Pin_1 then U56_Pin_2 then U56_Pin_3 then U56_Pin_4 then
        U56_Pin_5 then U56_Pin_6 then U56_Pin_7 then U56_Pin_8
indicate time_interval_x_o mean_and_standard_deviation
magnify x100
execute repetitively
```

APPENDIX B

| COMMAND | EXPLANATION |
|---|---|
| mark <id$_{a-x}$> | Positions the identified mark at the location of the user's cursor. |
| mark <id$_{a-x}$> on/off | Turns the identified mark on or off. |
| mark <id$_{a-x}$> on_location [named <name>] | Positions the identified mark at the identified location and associates an optional label with that spot in the trace. |
| mark <id$_{a-x}$>1 on_first_occurrence_of <event>[named <name>][before/after <<place>≠<id$_{a-x}$>1>] | Positions the identified mark at the first occurrence of a specified event that is before or after a specified place in the trace. An optional label can be associated with the event. |
| mark <id$_{a-d}$>on_all_occurrences_of <event>[named <name>][before/after <place>] | Positions the identified mark at each occurrence of a specified event occurring before or after a specified place in the trace. An optional label can be associated with the event. |
| indicate time_interval_x_o[mean_and_standard_deviation/maximum_and_minimum] | Used in a timing diagram or trace list specification to cause measurement of the time interval between marks "x" and "o". |

APPENDIX B

| | |
|---|---|
| indicate number_of_marks_x_o[maximum_and_minimum/mean_and_standard_deviation] | Used in a timing diagram or trace list specification to cause counting of the total number of marks "a" through "d" between marks "x" and "o". |
| process_for_data marked | Produces a trace list consisting solely of marked events. |
| halt_repetitive_execution when_time_x_o_is <relation><value><time unit> | Halts repetitive execution when the time between marks "x" and "o" in a completed trace measurement meets a specified criterion. |
| halt_repetitive_execution when_marks_x_o_are <relation><value> | Halts repetitive execution when the number of other marks between marks "x" and "o" in a completed trace measurement meets a specified criterion. |
| halt_repetitive_execution when_sequence_x_o_is <all marks>[then <all marks>]/ [then_not <some marks>][then <all marks>]/[then_not <some marks>][then <all marks>]/[then_not <some marks>] | Halts repetitive execution when a completed trace measurement exhibits between marks "x" and "o" the specified sequence of other marks. |
| halt_repetitive_execution when_runs_equals <value> | Halts repetitive execution when the number of completed trace measurements reaches a specified value. |

GRAMMAR

<...> denotes a lexical item in the syntax of a command; what appears within is not the thing itself, but a descriptor representing the thing.
[<item>] denotes that <item> is optional; also groups any enclosed items into a unit.
/ denotes logical disjunction (OR); exactly one of the items separated by the / replaces the entire string <item>/<item>/<item>...
In the definitions appearing below, items on the right of the :: sign and not within <...>'s are actual items themselves, save for /, which still means "OR". The :: sign may be read "is defined to be" or "may be replaced with."
$<id_{a-x}>$ :: a/b/c/d/o/x
$<id_{a-d}>$ :: a/b/c/d
<location> :: trigger/cursor/sample <#>
<#> :: 1/2/3/.../4096
<name> :: <one to nine alphanumeric characters>
<place> :: <location>/x/o
<event> :: entering/leaving <pattern>
:: greater_than/less_than <value> <time unit> _of <pattern>
:: any_transition_on <label>[or_on <label>[or_on ... ]]
:: any_glitch[on <glitch pattern>]
<pattern> :: <label> = <integer>[and <label> = <integer>[and....]]
:: <label> ≠ <integer>
<value> :: <numerical or arithmetic expression>
<time unit> :: sec/msec/μsec/nsec
:: <string associated in the format specification with a collection of probes>
<integer> :: <one or more binary/octal/decimal/hexadecimal digits>B/O/D/H
:: <one or more ASCII characters>A
<glitch pattern> :: <label>[or_on <label>[or_on ... ]]
:: <label> with <pattern>
<relation> :: greater_than/less_than
<all marks> :: mark_a/mark_b/mark_c/mark_d/any_mark
<some marks> :: marks_a/mark_b/mark_c/mark_d

APPENDIX C1
Format Specification

| | Pod_1 | | | | | | | | | Pod_1 | | | | | | | |
|---|---|---|---|---|---|---|---|---|---|---|---|---|---|---|---|---|---|
| Threshold: | ecl −1.3V | | | | ecl −1.3V | | | | Threshold: | ecl −1.3V | | | | ecl −1.3V | | | |
| Label | 7 | 6 | 5 | 4 | 3 | 2 | 1 | 0 | polarity | Label | 7 | 6 | 5 | 4 | 3 | 2 | 1 | 0 | polarity |
| U56_Pin_1 | | | | | | | | * | pos_true | U56_Pin_2 | | | | | | | | * | pos_true |

APPENDIX C1
Format Specification

| | Pod_1 | | | | | | | | |
|---|---|---|---|---|---|---|---|---|---|
| Threshold: | ecl −1.3V | | | | ecl −1.3V | | | | |
| Label | 7 | 6 | 5 | 4 | 3 | 2 | 1 | 0 | polarity |
| U56_Pin_3 | | | | | | * | | | pos_true |
| U56_Pin_4 | | | | | * | | | | pos_true |
| U56_Pin_5 | | | | * | | | | | pos_true |
| U56_Pin_6 | | | * | | | | | | pos_true |
| U56_Pin_7 | | * | | | | | | | pos_true |
| U56_Pin_8 | * | | | | | | | | pos_true |
| U56_ALL | * | * | * | * | * | * | * | * | pos_true |

APPENDIX C2
Trace Specification

TRIGGER
on entering U56_ALL = 000
position_is center_of_trace
SAMPLE
period_is 5 nsec
rate_is 200 MHz

APPENDIX C3
Post_process Specification

| MARK | STATUS | on_first_occurrence_of | NAME |
|---|---|---|---|
| x | on | entering U56_Pin_1 = 1 after trigger | START |

APPENDIX C3
Post_process Specification

| | | | |
|---|---|---|---|
| o | on | entering U56_Pin_1 = 1 after mark_x | STOP |

APPENDIX D1
Format Specification

| | Pod_1 | | | | | | | | |
|---|---|---|---|---|---|---|---|---|---|
| Threshold: | ecl −1.3V | | | | ecl −1.3V | | | | |
| Label | 7 | 6 | 5 | 4 | 3 | 2 | 1 | 0 | polarity |
| U56_Pin_1 | | | | | | | | * | pos_true |
| U56_Pin_2 | | | | | | | * | | pos_true |
| U56_Pin_3 | | | | | | * | | | pos_true |
| U56_Pin_4 | | | | | * | | | | pos_true |
| U56_Pin_5 | | | | * | | | | | pos_true |
| U56_Pin_6 | | | * | | | | | | pos_true |
| U56_Pin_7 | | * | | | | | | | pos_true |
| U56_Pin_8 | * | | | | | | | | pos_true |
| U56_ALL | * | * | * | * | * | * | * | * | pos_true |

APPENDIX D2
Trace Specification

TRIGGER
on entering U56_ALL = 000
position_is center_of_trace
SAMPLE
period_is 5 nsec
rate_is 200 MHz

APPENDIX D3
Post_process Specification

| MARK | STATUS | on_first_occurrence_of | NAME |
|---|---|---|---|
| x | on | greater_than 10.0000 nsec_of U56_ALL = 001 after trigger | START |
| o | on | greater_than 10.0000 nsec_of U56_ALL = 000 after mark_x | STOP |
| MARK | STATUS | on_all_occurrences_of | NAME |
| a | on | entering U56_Pin_4 = 1 | B4_HIGH |
| b | on | entering U56_Pin_5 = 1 before trigger | B5_HIGH |
| c | on | entering U56_Pin_6 = 1 | B6_HIGH |
| d | on | any_transition_on U56_Pin_8 | ANY_TRANS |

HALT_REPETITIVE_EXECUTION
when_sequence_x_o mark_a then mark_a then_not mark_d

APPENDIX E
Trace List

| | 5 nsec/sample | | Marks x_o 22.0 |
|---|---|---|---|
| | | | Runs=20  Max=22.0  Min=22.0 |
| Label: | U56_ALL | time count | mark names |
| Base: | hex | rel | |
| −2030 | DC | 0.0 nsec | |
| −2029 | DC | 5.0 nsec | |
| −2028 | DC | 5.0 nsec | |
| −2027 | DC | 5.0 nsec | |
| −2026 | DD | 5.0 nsec | |
| −2025 | DD | 5.0 nsec | |
| −2024 | DD | 5.0 nsec | |
| −2023 | DD | 5.0 nsec | |
| −2022 | DD | 5.0 nsec | |
| −2021 | DD | 5.0 nsec | |
| −2020 | DD | 5.0 nsec | |
| −2019 | DE | 5.0 nsec | |
| −2018 | DE | 5.0 nsec | |
| −2017 | DE | 5.0 nsec | |
| −2016 | DE | 5.0 nsec | |
| −2015 | DE | 5.0 nsec | |

-continued

APPENDIX E
Trace List

| | | | |
|---|---|---|---|
| −2014 | DE | 5.0 nsec | |
| −2013 | DE | 5.0 nsec | |
| −2012 | DF | 5.0 nsec | |
| −2011 | DF | 5.0 nsec | |
| −2010 | DF | 5.0 nsec | |
| −2009 | DF | 5.0 nsec | |
| −2008 | DF | 5.0 nsec | |
| −2007 | DF | 5.0 nsec | |
| −2006 | DF | 5.0 nsec | |
| −2005_c | E0 | 5.0 nsec | B6_HIGH |
| −2004 | E0 | 5.0 nsec | |
| −2003 | E0 | 5.0 nsec | |
| −2002 | E0 | 5.0 nsec | |
| −2001 | E0 | 5.0 nsec | |
| −2000 | E0 | 5.0 nsec | |
| −1999 | E0 | 5.0 nsec | |
| −1998 | E1 | 5.0 nsec | |
| −1997 | E1 | 5.0 nsec | |
| −1996 | E1 | 5.0 nsec | |
| −1995 | E1 | 5.0 nsec | |
| −1994 | E1 | 5.0 nsec | |
| −1993 | E1 | 5.0 nsec | |
| −1992 | E1 | 5.0 nsec | |
| −1991 | E2 | 5.0 nsec | |
| −1990 | E2 | 5.0 nsec | |
| −1989 | E2 | 5.0 nsec | |
| −1988 | E2 | 5.0 nsec | |
| −1987 | E2 | 5.0 nsec | |
| −1986 | E2 | 5.0 nsec | |
| −1985 | E2 | 5.0 nsec | |
| −1984 | E3 | 5.0 nsec | |
| −1983 | E3 | 5.0 nsec | |
| −1982 | E3 | 5.0 nsec | |
| −1981 | E3 | 5.0 nsec | |
| −1980 | E3 | 5.0 nsec | |
| −1979 | E3 | 5.0 nsec | |
| −1978 | E3 | 5.0 nsec | |
| −1977 | E4 | 5.0 nsec | |
| −1976 | E4 | 5.0 nsec | |
| −1975 | E4 | 5.0 nsec | |
| −1974 | E4 | 5.0 nsec | |
| −1973 | E4 | 5.0 nsec | |
| −1972 | E4 | 5.0 nsec | |
| −1971 | E4 | 5.0 nsec | |
| −1970 | E5 | 5.0 nsec | |
| −1969 | E5 | 5.0 nsec | |
| −1968 | E5 | 5.0 nsec | |
| −1967 | E5 | 5.0 nsec | |
| −1966 | E5 | 5.0 nsec | |
| −1965 | E5 | 5.0 nsec | |
| −1964 | E5 | 5.0 nsec | |
| −1963 | E6 | 5.0 nsec | |
| −1962 | E6 | 5.0 nsec | |
| −1961 | E6 | 5.0 nsec | |
| −1960 | E6 | 5.0 nsec | |
| −1959 | E6 | 5.0 nsec | |
| −1958 | E6 | 5.0 nsec | |
| −1957 | E6 | 5.0 nsec | |
| −1956 | E7 | 5.0 nsec | |
| −1955 | E7 | 5.0 nsec | |
| −1954 | E7 | 5.0 nsec | |
| −1953 | E7 | 5.0 nsec | |
| −1952 | E7 | 5.0 nsec | |
| −1951 | E7 | 5.0 nsec | |
| −1950_a | E8 | 5.0 nsec | B4_HIGH |
| −1949 | E8 | 5.0 nsec | |
| −1948 | E8 | 5.0 nsec | |
| −1947 | E8 | 5.0 nsec | |
| −1946 | E8 | 5.0 nsec | |
| ***** | ** | ******* | Samples −1945 through −0057 have been |
| −0058 | F7 | 5.0 nsec | omitted from this illustration. |
| −0057 | F7 | 5.0 nsec | |
| −0056_a | F8 | 5.0 nsec | B4_HIGH |
| −0055 | F8 | 5.0 nsec | |
| −0054 | F8 | 5.0 nsec | |
| −0053 | F8 | 5.0 nsec | |
| −0052 | F8 | 5.0 nsec | |
| −0051 | F8 | 5.0 nsec | |
| −0050 | F8 | 5.0 nsec | |
| −0049 | F9 | 5.0 nsec | |

APPENDIX E
Trace List

| | | | |
|---|---|---|---|
| −0048 | F9 | 5.0 nsec | |
| −0047 | F9 | 5.0 nsec | |
| −0046 | F9 | 5.0 nsec | |
| −0045 | F9 | 5.0 nsec | |
| −0044 | F9 | 5.0 nsec | |
| −0043 | F9 | 5.0 nsec | |
| −0042 | FA | 5.0 nsec | |
| −0041 | FA | 5.0 nsec | |
| −0040 | FA | 5.0 nsec | |
| −0039 | FA | 5.0 nsec | |
| −0038 | FA | 5.0 nsec | |
| −0037 | FA | 5.0 nsec | |
| −0036 | FA | 5.0 nsec | |
| −0035 | FB | 5.0 nsec | |
| −0034 | FB | 5.0 nsec | |
| −0033 | FB | 5.0 nsec | |
| −0032 | FB | 5.0 nsec | |
| −0031 | FB | 5.0 nsec | |
| −0030 | FB | 5.0 nsec | |
| −0029 | FB | 5.0 nsec | |
| −0028 | FC | 5.0 nsec | |
| −0027 | FC | 5.0 nsec | |
| −0026 | FC | 5.0 nsec | |
| −0025 | FC | 5.0 nsec | |
| −0024 | FC | 5.0 nsec | |
| −0023 | FC | 5.0 nsec | |
| −0022 | FC | 5.0 nsec | |
| −0021 | FD | 5.0 nsec | |
| −0020 | FD | 5.0 nsec | |
| −0019 | FD | 5.0 nsec | |
| −0018 | FD | 5.0 nsec | |
| −0017 | FD | 5.0 nsec | |
| −0016 | FD | 5.0 nsec | |
| −0015 | FD | 5.0 nsec | |
| −0014 | FE | 5.0 nsec | |
| −0013 | FE | 5.0 nsec | |
| −0012 | FE | 5.0 nsec | |
| −0011 | FE | 5.0 nsec | |
| −0010 | FE | 5.0 nsec | |
| −0009 | FE | 5.0 nsec | |
| −0008 | FE | 5.0 nsec | |
| −0007 | FF | 5.0 nsec | |
| −0006 | FF | 5.0 nsec | |
| −0005 | FF | 5.0 nsec | |
| −0004 | FF | 5.0 nsec | |
| −0003 | FF | 5.0 nsec | |
| −0002 | FF | 5.0 nsec | |
| −0001 | F7 | 5.0 nsec | |
| trigg_d | 00 | 5.0 nsec | ANY_TRANS |
| +0001 | 00 | 5.0 nsec | |
| +0002 | 00 | 5.0 nsec | |
| +0003 | 00 | 5.0 nsec | |
| +0004 | 00 | 5.0 nsec | |
| +0005 | 00 | 5.0 nsec | |
| +0006 | 00 | 5.0 nsec | |
| +0007 | 01 | 5.0 nsec | |
| +0008 | 01 | 5.0 nsec | |
| +0009_x | 01 | 5.0 nsec | START |
| +0010 | 01 | 5.0 nsec | |
| +0011 | 01 | 5.0 nsec | |
| +0012 | 01 | 5.0 nsec | |
| +0013 | 00 | 5.0 nsec | |
| +0014 | 02 | 5.0 nsec | |
| +0015 | 02 | 5.0 nsec | |
| +0016 | 02 | 5.0 nsec | |
| +0017 | 02 | 5.0 nsec | |
| +0018 | 02 | 5.0 nsec | |
| +0019 | 02 | 5.0 nsec | |
| +0020 | 02 | 5.0 nsec | |
| +0021 | 03 | 5.0 nsec | |
| +0022 | 03 | 5.0 nsec | |
| +0023 | 03 | 5.0 nsec | |
| +0024 | 03 | 5.0 nsec | |
| +0025 | 03 | 5.0 nsec | |
| +0026 | 03 | 5.0 nsec | |
| +0027 | 04 | 5.0 nsec | |
| +0028 | 04 | 5.0 nsec | |
| +0029 | 04 | 5.0 nsec | |
| +0030 | 04 | 5.0 nsec | |
| +0031 | 04 | 5.0 nsec | |

APPENDIX E
Trace List

| | | | |
|---|---|---|---|
| +0032 | 04 | 5.0 nsec | |
| +0033 | 04 | 5.0 nsec | |
| +0034 | 05 | 5.0 nsec | |
| +0035 | 05 | 5.0 nsec | |
| +0036 | 05 | 5.0 nsec | |
| +0037 | 05 | 5.0 nsec | |
| +0038 | 05 | 5.0 nsec | |
| +0039 | 05 | 5.0 nsec | |
| +0040 | 05 | 5.0 nsec | |
| +0041 | 06 | 5.0 nsec | |
| +0042 | 06 | 5.0 nsec | |
| +0043 | 06 | 5.0 nsec | |
| +0044 | 06 | 5.0 nsec | |
| +0045 | 06 | 5.0 nsec | |
| +0046 | 06 | 5.0 nsec | |
| +0047 | 06 | 5.0 nsec | |
| +0048 | 07 | 5.0 nsec | |
| +0049 | 07 | 5.0 nsec | |
| +0050 | 07 | 5.0 nsec | |
| +0051 | 07 | 5.0 nsec | |
| +0052 | 07 | 5.0 nsec | |
| +0053 | 07 | 5.0 nsec | |
| +0054 | 07 | 5.0 nsec | |
| +0055__a | 08 | 5.0 nsec | B4__HIGH |
| +0056 | 08 | 5.0 nsec | |
| +0057 | 08 | 5.0 nsec | |
| +0058 | 08 | 5.0 nsec | |
| +0059 | 08 | 5.0 nsec | |
| +0060 | 08 | 5.0 nsec | |
| ***** | ** | ******* | Samples +0061 through +1911 have been omitted from this illustration. |
| +1912 | 12 | 5.0 nsec | |
| +1913 | 12 | 5.0 nsec | |
| +1914 | 13 | 5.0 nsec | |
| +1915 | 13 | 5.0 nsec | |
| +1916 | 13 | 5.0 nsec | |
| +1917 | 13 | 5.0 nsec | |
| +1918 | 13 | 5.0 nsec | |
| +1919 | 13 | 5.0 nsec | |
| +1920 | 13 | 5.0 nsec | |
| +1921 | 14 | 5.0 nsec | |
| +1922 | 14 | 5.0 nsec | |
| +1923 | 14 | 5.0 nsec | |
| +1924 | 14 | 5.0 nsec | |
| +1925 | 14 | 5.0 nsec | |
| +1926 | 14 | 5.0 nsec | |
| +1927 | 14 | 5.0 nsec | |
| +1928 | 15 | 5.0 nsec | |
| +1929 | 15 | 5.0 nsec | |
| +1930 | 15 | 5.0 nsec | |
| +1931 | 15 | 5.0 nsec | |
| +1932 | 15 | 5.0 nsec | |
| +1933 | 15 | 5.0 nsec | |
| +1934 | 15 | 5.0 nsec | |
| +1935 | 16 | 5.0 nsec | |
| +1936 | 16 | 5.0 nsec | |
| +1937 | 16 | 5.0 nsec | |
| +1938 | 16 | 5.0 nsec | |
| +1939 | 16 | 5.0 nsec | |
| +1940 | 16 | 5.0 nsec | |
| +1941 | 16 | 5.0 nsec | |
| +1942 | 17 | 5.0 nsec | |
| +1943 | 17 | 5.0 nsec | |
| +1944 | 17 | 5.0 nsec | |
| +1945 | 17 | 5.0 nsec | |
| +1946 | 17 | 5.0 nsec | |
| +1947 | 17 | 5.0 nsec | |
| +1948 | 13 | 5.0 nsec | |
| +1949__a | 18 | 5.0 nsec | B4__HIGH |
| +1950 | 18 | 5.0 nsec | |
| +1951 | 18 | 5.0 nsec | |
| +1952 | 18 | 5.0 nsec | |
| +1953 | 18 | 5.0 nsec | |
| +1954 | 18 | 5.0 nsec | |
| +1955 | 18 | 5.0 nsec | |
| +1956 | 19 | 5.0 nsec | |
| +1957 | 19 | 5.0 nsec | |
| +1958 | 19 | 5.0 nsec | |
| +1959 | 19 | 5.0 nsec | |
| +1960 | 19 | 5.0 nsec | |
| +1961 | 19 | 5.0 nsec | |

-continued
APPENDIX E
Trace List

| | | | |
|---|---|---|---|
| +1962 | 18 | 5.0 nsec | |
| +1963 | 1A | 5.0 nsec | |
| +1964 | 1A | 5.0 nsec | |
| +1965 | 1A | 5.0 nsec | |
| +1966 | 1A | 5.0 nsec | |
| +1967 | 1A | 5.0 nsec | |
| +1968 | 1A | 5.0 nsec | |
| +1969 | 1A | 5.0 nsec | |
| +1970 | 1B | 5.0 nsec | |
| +1971 | 1B | 5.0 nsec | |
| +1972 | 1B | 5.0 nsec | |
| +1973 | 1B | 5.0 nsec | |
| +1974 | 1B | 5.0 nsec | |
| +1975 | 1B | 5.0 nsec | |
| +1976 | 1C | 5.0 nsec | |
| +1977 | 1C | 5.0 nsec | |
| +1978 | 1C | 5.0 nsec | |
| +1979 | 1C | 5.0 nsec | |
| +1980 | 1C | 5.0 nsec | |
| +1981 | 1C | 5.0 nsec | |
| +1982 | 1C | 5.0 nsec | |
| +1983 | 1C | 5.0 nsec | |
| +1984 | 1D | 5.0 nsec | |
| +1985 | 1D | 5.0 nsec | |
| +1986 | 1D | 5.0 nsec | |
| +1987 | 1D | 5.0 nsec | |
| +1988 | 1D | 5.0 nsec | |
| +1989 | 1D | 5.0 nsec | |
| +1990 | 1E | 5.0 nsec | |
| +1991 | 1E | 5.0 nsec | |
| +1992 | 1E | 5.0 nsec | |
| +1993 | 1E | 5.0 nsec | |
| +1994 | 1E | 5.0 nsec | |
| +1995 | 1E | 5.0 nsec | |
| +1996 | 1E | 5.0 nsec | |
| +1997 | 1F | 5.0 nsec | |
| +1998 | 1F | 5.0 nsec | |
| +1999 | 1F | 5.0 nsec | |
| +2000 | 1F | 5.0 nsec | |
| +2001 | 1F | 5.0 nsec | |
| +2002 | 1F | 5.0 nsec | |
| +2003 | 1F | 5.0 nsec | |
| +2004_c | 20 | 5.0 nsec | B6_HIGH |
| +2005 | 20 | 5.0 nsec | |
| +2006 | 20 | 5.0 nsec | |
| +2007 | 20 | 5.0 nsec | |
| +2008 | 20 | 5.0 nsec | |
| +2009 | 20 | 5.0 nsec | |
| +2010 | 20 | 5.0 nsec | |
| +2011 | 21 | 5.0 nsec | |
| +2012 | 21 | 5.0 nsec | |
| +2013 | 21 | 5.0 nsec | |
| +2014 | 21 | 5.0 nsec | |
| +2015 | 21 | 5.0 nsec | |
| +2016 | 21 | 5.0 nsec | |
| +2017 | 21 | 5.0 nsec | |
| +2018 | 22 | 5.0 nsec | |
| +2019 | 22 | 5.0 nsec | |
| +2020 | 22 | 5.0 nsec | |
| +2021 | 22 | 5.0 nsec | |
| +2022 | 22 | 5.0 nsec | |
| +2023 | 22 | 5.0 nsec | |
| +2024 | 22 | 5.0 nsec | |
| +2025 | 23 | 5.0 nsec | |
| +2026 | 23 | 5.0 nsec | |
| +2027 | 23 | 5.0 nsec | |
| +2028 | 23 | 5.0 nsec | |
| +2029 | 23 | 5.0 nsec | |

APPENDIX F1
Post_process Specification

| MARK | STATUS | on_first occurrence_of | NAME |
|---|---|---|---|
| x | on | greater_than 10.0000 nsec_of U56_ALL = 001 after trigger | START |
| o | on | greater_than 10.0000 nsec_of U56_ALL = 000 after mark_x | STOP |

-continued
APPENDIX F1
Post_process Specification

| MARK | STATUS | on_all_occurrences_of | NAME |
|------|--------|------------------------|------|
| a | on | entering U56_Pin_4 = 1 | B4_HIGH |
| b | on | entering U56_Pin_5 = 1 before trigger | B5_HIGH |
| c | on | entering U56_Pin_6 = 1 | B6_HIGH |
| d | on | any_transition_on U56_Pin_8 | ANY_TRANS |

HALT_REPETITIVE_EXECUTION
when_sequence_x_o mark_a then mark_a then_not mark_d
PROCESS_FOR_DATA
marked

APPENDIX F2
Trace List

| Processed Label: | Base: | 5 nsec/sample Runs=20 Max=22.0 Min=22.0 time count rel | Marks x_o 22.0 mark names |
|---|---|---|---|
| | U56_ALL hex | | |
| −2005_c | E0 | 0.0 nsec | B6_HIGH |
| −1950_a | E8 | 275.0 nsec | B4_HIGH |
| −1894_b | F0 | 280.0 nsec | B5_HIGH |
| −1838_a | F8 | 280.0 nsec | B4_HIGH |
| −1782_d | 00 | 280.0 nsec | ANY_TRANS |
| −1727_a | 08 | 275.0 nsec | B4_HIGH |
| −1671_b | 10 | 280.0 nsec | B5_HIGH |
| −1615_a | 18 | 280.0 nsec | B4_HIGH |
| −1560_c | 20 | 275.0 nsec | B6_HIGH |
| −1504_a | 28 | 280.0 nsec | B4_HIGH |
| −1448_b | 30 | 280.0 nsec | B5_HIGH |
| −1393_a | 38 | 275.0 nsec | B4_HIGH |
| −1281_a | 48 | 560.0 nsec | B4_HIGH |
| −1226_b | 50 | 275.0 nsec | B5_HIGH |
| −1170_a | 58 | 280.0 nsec | B4_HIGH |
| −1114_c | 60 | 280.0 nsec | B6_HIGH |
| −1058_a | 68 | 280.0 nsec | B4_HIGH |
| −1003_b | 70 | 275.0 nsec | B5_HIGH |
| −0947_a | 78 | 280.0 nsec | B4_HIGH |
| −0891_d | 80 | 280.0 nsec | ANY_TRANS |
| −0836_a | 88 | 275.0 nsec | B4_HIGH |
| −0780_b | 90 | 280.0 nsec | B5_HIGH |
| −0724_a | 98 | 280.0 nsec | B4_HIGH |
| −0669_c | A0 | 275.0 nsec | B6_HIGH |
| −0613_a | A8 | 280.0 nsec | B4_HIGH |
| −0557_b | B0 | 280.0 nsec | B5_HIGH |
| −0502_a | B8 | 275.0 nsec | B4_HIGH |
| −0390_a | C8 | 560.0 nsec | B4_HIGH |
| −0335_b | D0 | 275.0 nsec | B5_HIGH |
| −0279_a | D8 | 280.0 nsec | B4_HIGH |
| −0223_c | E0 | 280.0 nsec | B6_HIGH |
| −0168_a | E8 | 275.0 nsec | B4_HIGH |
| −0112_b | F0 | 280.0 nsec | B5_HIGH |
| −0056_a | F8 | 280.0 nsec | B4_HIGH |
| trigg_d | 00 | 280.0 nsec | ANY_TRANS |
| +0009_x | 01 | 45.0 nsec | START |
| +0055_a | 08 | 230.0 nsec | B4_HIGH |
| +0167_a | 18 | 560.0 nsec | B4_HIGH |
| +0222_c | 20 | 275.0 nsec | B6_HIGH |
| +0278_a | 28 | 280.0 nsec | B4_HIGH |
| +0389_a | 38 | 555.0 nsec | B4_HIGH |
| +0501_a | 48 | 560.0 nsec | B4_HIGH |
| +0612_a | 58 | 555.0 nsec | B4_HIGH |
| +0668_c | 60 | 280.0 nsec | B6_HIGH |
| +0723_a | 68 | 275.0 nsec | B4_HIGH |
| +0835_a | 78 | 560.0 nsec | B4_HIGH |
| +0891_d | 80 | 280.0 nsec | ANY_TRANS |
| +0946_a | 88 | 275.0 nsec | B4_HIGH |
| +1058_a | 98 | 560.0 nsec | B4_HIGH |
| +1113_c | A0 | 275.0 nsec | B6_HIGH |
| +1169_a | A8 | 280.0 nsec | B4_HIGH |
| +1280_a | B8 | 555.0 nsec | B4_HIGH |
| +1392_a | C8 | 560.0 nsec | B4_HIGH |
| +1503_a | D8 | 555.0 nsec | B4_HIGH |
| +1559_c | E0 | 280.0 nsec | B6_HIGH |
| +1614_a | E8 | 275.0 nsec | B4_HIGH |
| +1726_a | F8 | 560.0 nsec | B4_HIGH |
| +1782_d | 00 | 280.0 nsec | ANY_TRANS |
| +1784_o | 00 | 10.0 nsec | STOP |

-continued
APPENDIX F2
Trace List

| +1837_a | 08 | 265.0 nsec | B4_HIGH |
|---|---|---|---|
| +1949_a | 18 | 560.0 nsec | B4_HIGH |
| +2004_c | 20 | 275.0 nsec | B6_HIGH |

We claim:

1. Apparatus for monitoring a plurality of signals in a system under test, the apparatus comprising:
   means for sampling the values of a plurality of source signals in a workpiece system, for determining the logic values of the samples according to selected thresholds and polarities and for producing according to the samples a plurality of logic signals having successive collections of corresponding logic signal values;
   means coupled to the logic signals for storing the individual logic signal values within each successive collection thereof;
   means for defining a logic condition upon at least two consecutive collections of logic signal values and for associating a symbol with the defined logic condition;
   means responsive to the defined logic condition for searching through the stored logic signal values and for identifying instances therein corresponding to the defined logic condition; and
   means coupled to the stored collections of logic signal values and responsive to the identified instances for reconstructing an indication of the activity of the plurality of source signals as recorded by the stored successive collections of logic signal values, the reconstructed indication including for each identified instance of the defined logic condition the symbol associated therewith.

2. Apparatus as in claim 1 wherein the apparatus comprises a timing analyzer and the means for sampling does sample the source signals, does determine the logic signal values and does produce the successive collections at a regular and periodic rate.

3. Apparatus as in claim 1 wherein the apparatus comprises a logic state analyzer that further comprises means for coupling to at least one source clock signal in the workpiece system and for producing a detected clock signal, and further wherein the means for sampling does sample the source signals, does determine the logic signal values and does produce the successive collections in response to transitions in the detected clock signal.

4. Apparatus as in claim 1 wherein the defined logic condition specifies entering a simultaneous combination of logic signal values.

5. Apparatus as in claim 4 wherein the simultaneous combination of logic signal values is expressable as the union of a plurality of other simultaneous combinations of values of disjoint subsets of the logic signals.

6. Apparatus as in claim 1 wherein the defined logic condition specifies leaving a simultaneous combination of logic signal values.

7. Apparatus as in claim 6 wherein the simultaneous combination of logic signal values is expressable as the union of a plurality of other simultaneous combinations of values of disjoint subsets of the logic signals.

8. Apparatus as in claim 1 wherein the defined logic condition specifies a simultaneous combination of logic signal values that must obtain for at least a time interval of selectable duration.

9. Apparatus as in claim 8 wherein the simultaneous combination of logic signal values is expressable as the union of a plurality of other simultaneous combinations of values of disjoint subsets of the logic signals.

10. Apparatus as in claim 1 wherein the defined logic condition specifies a simultaneous combination of logic signal values that must obtain and also obtain for less than a time interval of selectable duration.

11. Apparatus as in claim 10 wherein the simultaneous combination of logic signal values is expressable as the union of a plurality of other simultaneous combinations of values of disjoint subsets of the logic signals.

12. Apparatus as in claim 1 wherein the defined logic condition specifies any transition in any logic signal in a subset of the logic signals.

13. Apparatus as in claim 12 wherein the subset of the logic signals is expressable as the union of a plurality of disjoint other subsets of the logic signals.

14. Apparatus as in claim 1 wherein the satisfaction of the defined logic condition is contingent upon prior satisfaction of another defined logic condition associated with another symbol.

15. Apparatus as in claim 1 wherein the satisfaction of the defined logic condition is contingent upon prior nonsatisfaction of another defined logic condition associated with another symbol.

16. Apparatus as in claim 1 wherein the symbol associated with the defined logic condition appears in the reconstructed indication at a location corresponding to the onset of the satisfaction of the defined logic condition.

17. Apparatus as in claim 1 wherein the symbol associated with the defined logic condition appears in the reconstructed indication at a location corresponding to the onset of that combination of source signal values causing satisfaction of the defined logical condition.

18. Apparatus as in claim 1 wherein the symbol associated with the defined logic condition appears in the reconstructed indication at a location corresponding to the conclusion of the satisfaction of the defined logic condition.

19. Apparatus as in claim 1 wherein the symbol associated with the defined logic condition is a discrete symbol.

20. Apparatus as in claim 19 wherein the discrete symbol is an ASCII character.

21. Apparatus as in claim 1 wherein the reconstructed indication is a waveform diagram rendered principally in a first color and the symbol associated with the defined logic condition is a portion of the waveform diagram rendered in a second color.

22. Apparatus as in claim 1 wherein a plurality of logic conditions are definable and wherein a separate symbol is associated with each defined logic condition.

23. Apparatus as in claim 22 further comprising means responsive to the identified instances of the separate symbols associated with the plurality of defined logic conditions, said means for measuring a parameter that begins upon a first one of said identified instances and that ends upon a second one of said identified instances.

24. Apparatus as in claim 23 wherein the parameter is the time interval between said first and second identified instances.

25. Apparatus as in claim 23 wherein the parameter is the number of other said identified instances occurring between said first and second identified instances.

26. Apparatus as in claim 23 wherein the means for storing the individual logic signal values is repeatedly filled a selected number of times, wherein the parameter is measured each time the means for storing is filled, and further comprising means for calculating statistics associated with the measured parameter values.

27. Apparatus as in claim 26 wherein the statistics include the minimum and maximum values.

28. Apparatus as in claim 26 wherein the statistics include the mean and standard deviation.

29. Apparatus for monitoring a plurality of signals in a system under test, the apparatus comprising:

means for generating a periodic sampling signal;

means, couplable to the plurality of source signals and responsive to the sampling signal, for sampling the values of a plurality of source signals in a workpiece system, for determining the logic values of the samples according to selected thresholds and polarities and for producing according to the samples a plurality of logic signals having successive collections of corresponding logic signal values;

means, couplable to the plurality of source signals and responsive to the sampling signal, for detecting glitches upon each of the source signals and for producing a plurality of glitch signals that has, according to transitions in the sampling signal, successive collections of glitch signal values, each signal value of which is indicative of the presence and absence of a glitch upon the corresponding source signal during the preceding period of the sampling signal;

means coupled to the logic signals and to the glitch signals for storing the individual logic and glitch signal values within each of the successive collections thereof;

means for defining a logic condition including glitch signal values and for associating a symbol with the defined logic condition;

means responsive to the defined logic condition for searching through the stored logic and glitch signal values and for identifying instances therein corresponding to the defined logic condition; and means coupled to the stored collections of logic and glitch signal values and responsive to the identified instances for reconstructing an indication of the activity of the plurality of source signals as recorded by the stored successive collections of logic and glitch signal values, the reconstructed indication including for each identified instance of the defined logic condition the symbol associated therewith.

30. Apparatus as in claim 29 wherein the defined logic condition further comprises the detection of any glitch is the union of some disjoint subsets of the source signals.

31. Apparatus for detecting the occurrence of a selected condition in a plurality of workpiece signals in a system under test, the apparatus comprising:
- first means for repetitively making and storing trace measurements which each comprise successive collections of logically quantized samples of the workpiece signals, and responsive to the fourth means recited below by discontinuing the repetitive making and storing of trace measurements upon receipt of an indication that the selected condition recited below has obtained;
- second means, coupled to the first means, for inspecting each trace measurement and for augmenting each inspected trace measurement with marks according to logical relationships defined upon the workpiece signals;
- third means for defining a selected condition upon marks within an augmented trace measurement;
- fourth means, responsive to the selected condition and to the augmented trace measurement, for examining the latter to determine if the selected condition obtains, the fourth means coupled to the first means for communicating thereto an indication that the selected condition has obtained; and
- fifth means, responsive to the augmented trace measurement, for displaying a reconstructed indication of the activity of the workpiece signals according to the stored and logically quantized samples of the most recent trace measurement, the reconstructed indication including any marks by which that trace measurement was augmented.

32. Apparatus as in claim 31 wherein the selected condition includes a specified time interval between two marks.

33. Apparatus as in claim 31 wherein the selected condition includes a specified number of occurrences of other marks between two particular marks.

34. Apparatus as in claim 31 wherein the selected condition includes a specified sequence of marks.

35. Apparatus as in claim 31 wherein the selected condition includes a specified number of repetitive trace measurements.

36. A method of monitoring a plurality of signals in a system under test, the method comprising the steps of:
- sampling according to selected thresholds and polarities the values of a plurality of source signals in a workpiece system to produce successive collections of corresponding pluralities of logic values;
- storing in a memory the individual logic values within each successive collection of logic values;
- defining a logic condition in the plurality of source signals;
- associating a symbol with the defined logic condition;
- searching through the stored collections of logic values to identify instances of the defined logic condition; and
- reconstructing an indication of the activity of the plurality of source signals as recorded by the stored successive collections of logic values and including for each identified instance of the defined logic condition the symbol associated therewith.

37. A method as in claim 36 wherein the sampling step is performed at a rate that is regular and periodic.

38. A method as in claim 36 wherein the sampling step is performed in response to a transition in a clock signal within the workpiece system.

* * * * *